US009026969B2

(12) United States Patent
Jang et al.

(10) Patent No.: US 9,026,969 B2
(45) Date of Patent: May 5, 2015

(54) METHOD OF DESIGNING ARRANGEMENT OF TSV IN STACKED SEMICONDUCTOR DEVICE AND DESIGNING SYSTEM FOR ARRANGEMENT OF TSV IN STACKED SEMICONDUCTOR DEVICE

(71) Applicant: Samsung Electronics Co., Ltd., Suwon-si (KR)

(72) Inventors: Myung-Soo Jang, Seoul (KR); Jae-Rim Lee, Hwaseong-si (KR); Jong-Wha Chong, Seoul (KR); Min-Beom Kim, Seoul (KR); Wen Rui Li, Seoul (KR); Cheol-Jon Jang, Seoul (KR)

(73) Assignees: Samsung Electronics Co., Ltd., Suwon-si (KR); Industry-University Cooperation Foundation Hanyang University, Seoul (KR)

( * ) Notice: Subject to any disclaimer, the term of this patent is extended or adjusted under 35 U.S.C. 154(b) by 0 days.

(21) Appl. No.: 14/203,650

(22) Filed: Mar. 11, 2014

(65) Prior Publication Data
US 2014/0258949 A1 Sep. 11, 2014

(30) Foreign Application Priority Data

Mar. 11, 2013 (KR) .................. 10-2013-0025466

(51) Int. Cl.
 G06F 17/50 (2006.01)
 G06F 9/455 (2006.01)
(52) U.S. Cl.
 CPC ........ *G06F 17/5081* (2013.01); *G06F 17/5072* (2013.01); *G06F 17/5077* (2013.01)

(58) Field of Classification Search
 USPC .................. 716/104, 106, 111, 126
 See application file for complete search history.

(56) References Cited

U.S. PATENT DOCUMENTS

| 6,539,528 | B2 | 3/2003 | Hwang et al. |
| 6,951,007 | B2 | 9/2005 | Kaida |
| 7,200,831 | B2 | 4/2007 | Kitabayashi |
| 7,271,488 | B2 | 9/2007 | Arakawa et al. |
| 7,772,880 | B2 | 8/2010 | Solomon |
| 8,136,071 | B2 * | 3/2012 | Solomon ............ 716/119 |
| 8,743,583 | B1 * | 6/2014 | Stephens, Jr. ........... 365/63 |
| 2007/0120260 | A1 * | 5/2007 | Kitabayashi et al. ....... 257/758 |
| 2008/0098340 | A1 | 4/2008 | Oh |

(Continued)

FOREIGN PATENT DOCUMENTS

| JP | 9-330983 A | 12/1997 |
| JP | 2004-47803 A | 2/2004 |

(Continued)

*Primary Examiner* — Brian Ngo
(74) *Attorney, Agent, or Firm* — Sughrue Mion, PLLC

(57) ABSTRACT

A method of designing arrangement of through silicon vias (TSVs) in a stacked semiconductor device is provided The method includes: determining a plurality of TSV candidate grids representing positions, into which the TSVs are insertable, in each of a plurality of semiconductor dies stacked mutually and included in a stacked semiconductor device; creating a plurality of path graphs representing linkable signal paths for a plurality of signals transmitted through the stacked semiconductor device, respectively, based on the TSV candidate grids; determining initial TSV insertion positions corresponding to shortest signal paths for the signals based on the path graphs; and determining final TSV insertion positions by verifying the initial TSV insertion positions so that a plurality of signal networks corresponding to the shortest signal paths for the signals have routability.

15 Claims, 24 Drawing Sheets

(56) References Cited

U.S. PATENT DOCUMENTS

2009/0144678 A1  6/2009  Bose et al.
2010/0031217 A1  2/2010  Sinha et al.
2012/0138927 A1* 6/2012  Kang ............................ 257/48

FOREIGN PATENT DOCUMENTS

JP         4447960 B2    4/2010
KR      1999-0065429 A   8/1999

* cited by examiner

FIG. 2
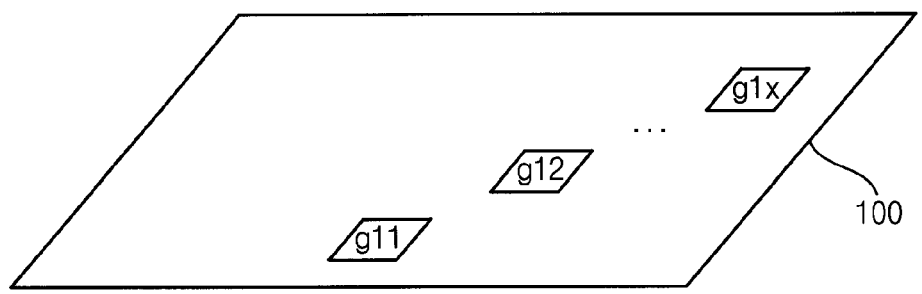
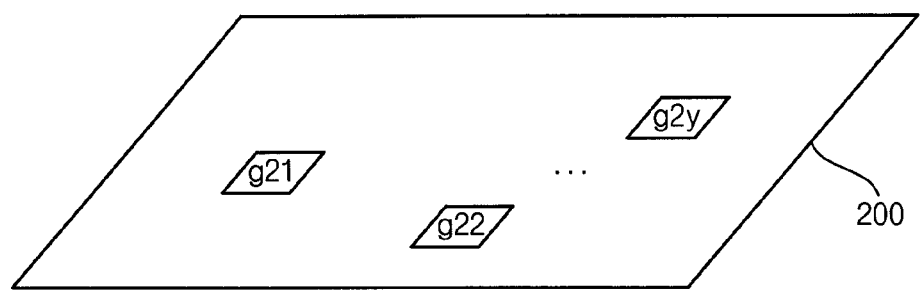
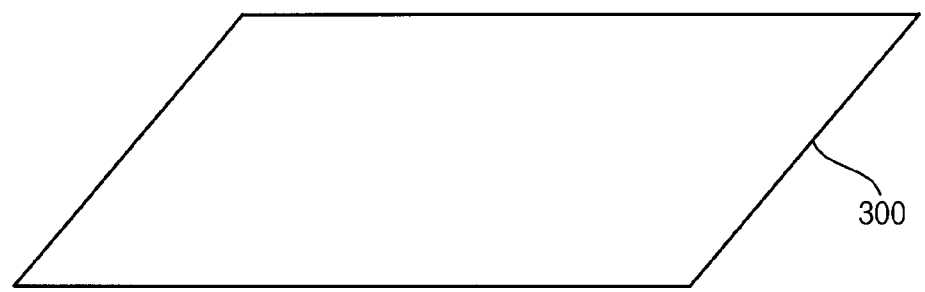
FIG. 3
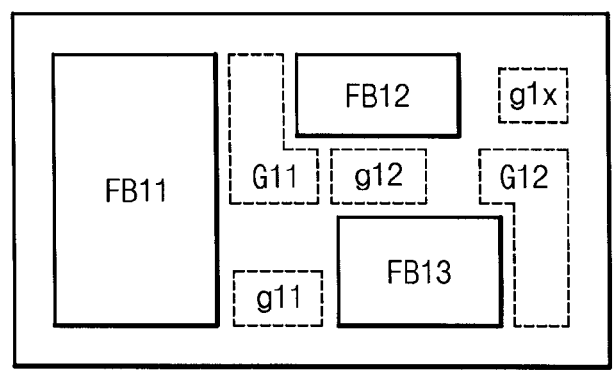

PGn

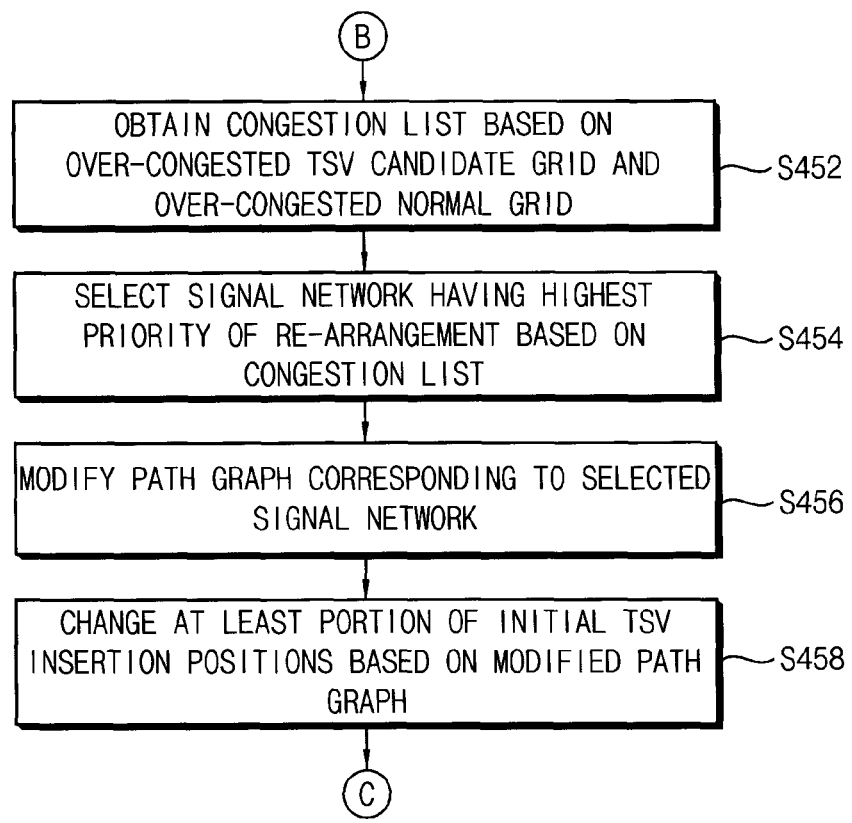

| NET NAME | INCREMENT |
|---|---|
| net2 | 3μm |
| net4 | 4μm |
| net9 | 7μm |
| ... | ... |

METHOD OF DESIGNING ARRANGEMENT OF TSV IN STACKED SEMICONDUCTOR DEVICE AND DESIGNING SYSTEM FOR ARRANGEMENT OF TSV IN STACKED SEMICONDUCTOR DEVICE

CROSS-REFERENCE TO RELATED APPLICATION

This application claims priority from Korean Patent Application No. 10-2013-0025466, filed on Mar. 11, 2013, in the Korean Intellectual Property Office (KIPO), the disclosure of which is incorporated herein in its entirety by reference.

BACKGROUND

1. Field

Apparatuses and methods consistent with exemplary embodiments relate to a semiconductor device, and more particularly to a method of designing arrangement of through silicon vias (TSVs) in a stacked semiconductor device and a designing system for arrangement of the TSVs in the stacked semiconductor device.

2. Description of the Related Art

As electronic devices have tended toward miniaturization with a light weight, even semiconductor devices included in the electronic devices are fabricated in a small size with a light weight. Recently, studies and research on a semiconductor device having vertically stacked semiconductor chips, that is, a three dimensional (3D) integrated circuit have been carried out to overcome limitation in a semiconductor integration process and improve a degree of integration of the semiconductor device. In general, the semiconductor chips in the 3D integrated circuit may be electrically connected to one another by using the TSVs.

SUMMARY

One or more exemplary embodiments are provided to address one or more problems caused by limitations and disadvantages of the related art.

One or more exemplary embodiments provide a method of designing arrangement of at least one TSV in a stacked semiconductor device, capable of effectively developing a stacked semiconductor device having an optimal signal path.

One or more exemplary embodiments provide a system for designing the arrangement of at least one TSV in the stacked semiconductor device, capable of effectively developing the stacked semiconductor device having the optimal signal path.

According to one aspect of an exemplary embodiment, there is provided a method of designing arrangement of TSVs in a stacked semiconductor device, the method including: determining a plurality of TSV candidate grids representing positions, into which the TSVs are insertable, with respect to each of a plurality of semiconductor dies stacked mutually and included in a stacked semiconductor device; creating a plurality of path graphs representing linkable signal paths for a plurality of signals transmitted through the stacked semiconductor device, respectively, based on the TSV candidate grids; determining initial TSV insertion positions corresponding to shortest signal paths for the signals based on the path graphs; and determining final TSV insertion positions by verifying the initial TSV insertion positions so that a plurality of signal networks corresponding to the shortest signal paths for the signals have routability.

In the creating the path graphs, a first path graph representing all linkable first signal paths from a first source to a first sink for a first signal of the signals may be created, and a second path graph representing all linkable second signal paths from a second source to a second sink for a second signal of the signals may be created.

In the creating the first path graph, the first source arranged in a first semiconductor die of the semiconductor dies and the first sink arranged in a second semiconductor die of the semiconductor dies may be determined, first TSV candidate grids arranged in the first semiconductor die may be selected from among the TSV candidate grids, the first source may be directly linked to each of the first TSV candidate grids, and each of the first TSV candidate grids may be linked to the first sink.

In the creating the first path graph, second TSV candidate grids, which are arranged in a third semiconductor die interposed between the first and second semiconductor dies, may be further selected from among the TSV candidate grids. In the linking the first sink to each of the first TSV candidate grids, each of the first TSV candidate grids may be directly linked to each of the second TSV candidate grids, and each of the second TSV candidate grids may be directly linked to the first sink.

The first path graph may have unidirectionality such that the all first signal paths to link the first source to the first sink include only one of the first TSV candidate grids.

In the determining the initial TSV insertion positions, a first shortest signal path may be obtained from among the first signal paths, and first TSV candidate grids included in the first shortest signal path among the TSV candidate grids may be selected as the initial TSV insertion positions for the first signal. Also, a second shortest signal path may be obtained from among the second signal paths, and second TSV candidate grids included in the second shortest signal path among the TSV candidate grids may be selected as the initial TSV insertion positions for the second signal.

In the determining the final TSV insertion positions, a verification operation may be performed to determine routability for first and second signal networks determined by the first and second path graphs when the first and second signal networks are formed by arranging a plurality of first TSVs in the first and second TSV candidate grids selected as the initial TSV insertion positions and by arranging a plurality of first wires on the semiconductor dies. Also, the initial TSV insertion positions may be selected as the final TSV insertion positions if it is determined that the first and second signal networks have the routability based on a result of the verification operation. Further, the initial TSV insertion positions may be updated if it is determined that at least one of the first and second signal networks has no routability based on the result of the verification operation.

Each of the semiconductor dies may include a plurality of normal grids representing insertable positions of wires, and the first wires may pass through first and second normal grids corresponding to the first and second signal networks among the normal grids. In the performing the verification operation, existence of an over-congested TSV candidate grid having TSVs arranged with a number larger than an allowable number of TSVs among the first and second TSV candidate grids may be determined by counting a number of the first TSVs arranged in the first and second TSV candidate grids. Also, existence of an over-congested normal grid having wires arranged with a number larger than an allowable number of TSVs among the first and second normal grids may be determined by counting a number of the first wires arranged in the first and second normal grids.

In the updating the initial TSV insertion positions, an over-congestion list listing at least one over-congested grid including the over-congested TSV candidate grid and the over-congested normal grid may be acquired. Also, a signal network having a highest priority of re-arrangement among the first and second signal networks, may be selected based on the over-congestion list, a path graph corresponding to the selected signal network among the path graphs may be modified, and at least a portion of the initial TSV insertion positions may be changed corresponding to the selected signal network and based on the modified path graph.

In the selecting the signal network having the highest priority of re-arrangement, a signal network passing through a largest number of over-congested grids among the first and second signal networks may be selected.

A signal network having a lowest length increment after the initial TSV insertion positions have been updated may be selected when the first and second signal networks pass through an equal number of the over-congested grids.

In the modifying the path graph corresponding to the selected signal network, the path graph corresponding to the selected signal network may be selected, and a congested region corresponding to the over-congested grids may be deleted from the selected path graph.

In the changing the at least a portion of the initial TSV insertion positions, a third shortest signal path may be obtained based on the path graph having no congested region. Also, a portion of the first and second TSV candidate grids, which is not included in the third shortest signal path, may be excluded from the initial TSV insertion positions, or a third TSV candidate grid, which is included in the third shortest signal path and different from the first and second TSV candidate grids, may be selected as the initial TSV insertion positions.

In the method of designing arrangement of the TSVs, a verification operation for the updated initial TSV insertion positions may be re-performed. The updating of the initial TSV insertion positions may be repeatedly performed until it is determined that the first and second signal networks have routability based on a result of the verification operation.

According to an aspect of another exemplary embodiment, there is provided a system for designing arrangement of TSVs in a stacked semiconductor device including a plurality of semiconductor dies stacked on one another, the system including: a grid determining unit, a path graph generating unit, a TSV positioning unit and a verifying unit. The grid determining unit may generate TSV candidate grid information related to positions, in which the TSVs are insertable, in the semiconductor dies based on function block arrangement information related to arrangement of a plurality of functional blocks included in the semiconductor dies. The path graph generating unit may generate path graph information related to a plurality of path graphs that represent all signal paths from at least one source to at least one sink for a plurality of signals transmitted through the stacked semiconductor device and have unidirectionality, based on the TSV candidate grid information. The TSV positioning unit may generate initial TSV insertion position information related to initial positions of the TSVs inserted into the stacked semiconductor device based on the path graph information such that a shortest signal path is formed with respect to each of the signals. The verifying unit may generate final TSV insertion position information related to final positions of the TSVs inserted into the stacked semiconductor device, or a control signal to update the path graph information and the initial TSV insertion position information, by performing a verification operation for the initial TSV insertion position information.

As described above, in the system and the method of designing arrangement of TSVs in a stacked semiconductor device according to the exemplary embodiments, the insertion positions of the TSVs can be determined in a state that a floor plan representing arrangement of a plurality of function blocks is designated. The verification operation and the update operation for the TSV insertion positions are repeated based on the TSV candidate grids, the normal grids, and the path graphs until the TSV connection failure and the wire failure do not occur, thereby designing the stacked semiconductor device having the optimized signal path without a TSV connection failure and a wire failure.

BRIEF DESCRIPTION OF THE DRAWINGS

Illustrative, non-limiting exemplary embodiments will be more clearly understood from the following detailed description taken in conjunction with the accompanying drawings, in which:

FIGS. 2 and 3 are views illustrating a method of designing arrangement of the TSVs in the stacked semiconductor device of FIG. 1, according to exemplary embodiments.

FIG. 17 is a flowchart illustrating the operation of updating the initial TV insertion positions of FIG. 13, according to an exemplary embodiment.

FIGS. 18A, 18B, 19A, 19B, 19C and 19D are views illustrating the operations of updating the initial TSV insertion positions of FIG. 17, according to exemplary embodiments.

DETAILED DESCRIPTION OF THE EXEMPLARY EMBODIMENTS

Figure 1:
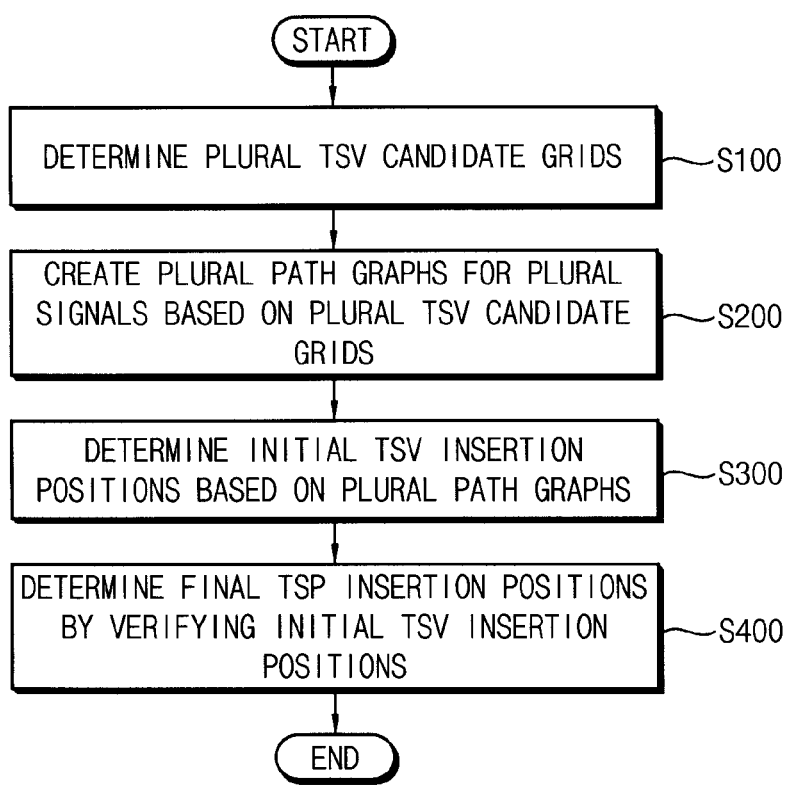
FIG. 1 is a flowchart illustrating a method of designing arrangement of TSVs in a stacked semiconductor device according to an exemplary embodiment.

The inventive concept will be described more fully with reference to the accompanying drawings, in which exemplary embodiments are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a flowchart illustrating a method of designing arrangement of TSVs in a stacked semiconductor device according to an exemplary embodiment.

This method of designing arrangement of the TSVs in the stacked semiconductor device may be used when designing the stacked semiconductor device including a plurality of stacked semiconductor dies. In particular, this method may be used when determining through silicon via (TSV) insertion positions formed through the semiconductor dies in order to electrically connect the semiconductor dies to one another.

Hereinafter, although the exemplary embodiments will be described with regard to a scheme of determining the TSV insertion positions, this method may be used to determine arrangement of predetermined vertical wires (that is, 3D wires) and/or plane wires (that is, 2D wire) included in the stacked semiconductor device.

Referring to FIG. 1, in the method of designing arrangement of the TSVs in the stacked semiconductor device according to the exemplary embodiment, a plurality of TSV candidate grids arranged in a plurality of semiconductor dies are determined (S100). As described above, the semiconductor dies are included in the stacked semiconductor device and mutually stacked. The TSV candidate grids represent positions into which TSVs may be inserted. According to an exemplary embodiment, after determining arrangement of a plurality of function blocks included in the semiconductor dies, the TSV candidate grids may be determined.

A plurality of path graphs representing linkable signal paths for a plurality of signals, respectively, are created based on the TSV candidate grids (S200). For example, each of the path graphs may represent all signal paths from a source of each signal to a sink of the signal.

Initial TSV insertion positions are determined based on the path graphs (S300), and final TSV insertion positions are determined by verifying the initial TSV insertion positions (S400). For example, the initial TSV insertion positions may be determined according to lengths of signal paths for each signal, and the final TSV insertion positions may be determined in such a manner that a plurality of signal networks (net), corresponding to a plurality of signal paths determining the initial TSV insertion positions, for the signals have routability.

FIGS. 2 and 3 are views illustrating a method of designing arrangement of the TSVs in the stacked semiconductor device of FIG. 1, according to exemplary embodiments. In particular, FIGS. 2 and 3 are views illustrating the operation of determining the TSV candidate grids (S100) as shown in FIG. 1.

Referring to FIGS. 2 and 3, a stacked semiconductor device 10 includes a plurality of semiconductor dies 100, 200 and 300 that are mutually stacked, and a plurality of TSV candidate grids g11, g12, ... and g1x, and g21, g22, ... and g2y are arranged in the semiconductor dies 100, 200 and 300.

These TSV candidate grids are determined based on arrangement of a plurality of function blocks included in the semiconductor dies 100, 200 and 300. In other words, in the method of designing arrangement of the TSVs in the stacked semiconductor device according to the exemplary embodiment, the insertion positions of the TSVs are determined in the state that a floor plan representing the arrangement of the function blocks is designated. For example, as illustrated in FIG. 3, the arrangement of function blocks FB11, FB12 and FB13 included in the semiconductor die 100 may be first determined, and the TSV candidate grids g11, ... and g1x may be determined based on the arrangement of the function blocks FB11, FB12 and FB13, that is, may be determined in regions in which the function blocks FB11, FB12 and FB13 are not arranged. The function blocks FB11, FB12 and FB13 serve as components to perform specific functions. Each of the function blocks FB11, FB12 and FB13 may include one of a core block including a central processing unit (CPU) and a memory controller, a display control block, a file system block, a graphic processing unit (GPU) block, an image signal processor block and a multi-format codec.

According to an exemplary embodiment, in addition to the TSV candidate grids g11, g12, . . . and g1x, and g21, g22, . . . and g2y, a plurality of normal grids may be determined. The stacked semiconductor device 10 includes not only vertical wires (that is, 3D wires) such as TSVs connecting the function blocks arranged in mutually different semiconductor dies to one another, but also plane wires (that is, 2D wires) to connect function blocks arranged in the same semiconductor die to one another. For example, as illustrated in FIG. 3, normal grids G11 and G12 may be determined based on the arrangement of the function blocks FB11, FB12 and FB13. For example, the normal grids G11 and G12 may be determined in regions in which the function blocks FB11, FB12 and FB13 are not arranged.

TSVs may not be inserted into the semiconductor die 300 positioned at the lowermost stage of the semiconductor dies 100, 200 and 300. Accordingly, the semiconductor die 300 may not include the TSV candidate grids.

Although not illustrated, similarly to the semiconductor die 100, each of the semiconductor dies 200 and 300 may include function blocks and normal grids. In addition, although FIG. 2 illustrates that the stacked semiconductor device 10 includes three semiconductor dies 100, 200 and 300, the stacked semiconductor device designed based on the method according to the exemplary embodiments may include an arbitrary number of semiconductor dies that are mutually stacked.

Figure 4:
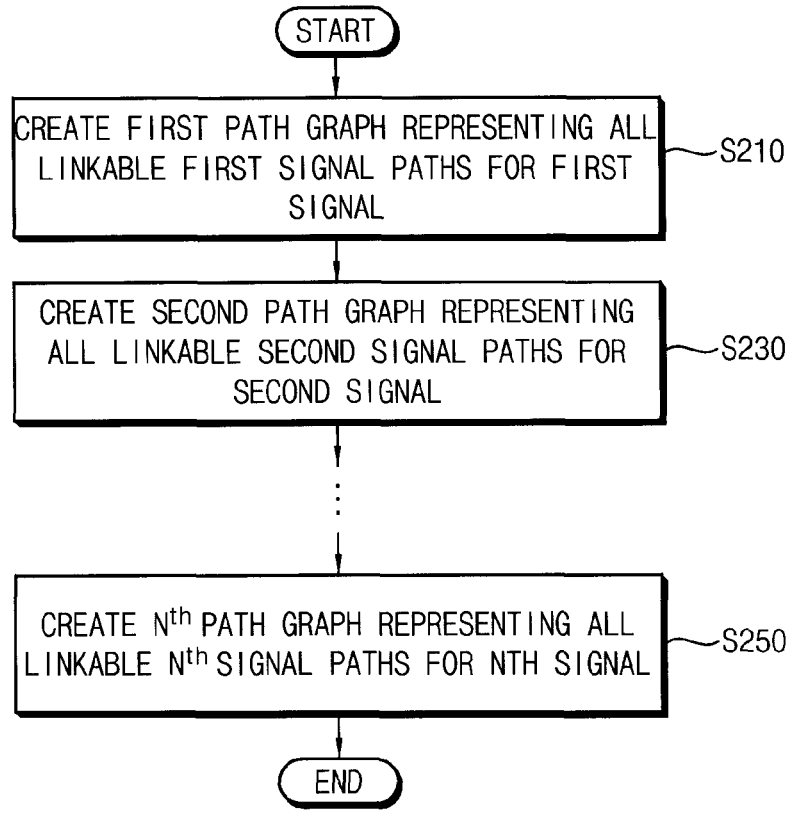
FIG. 4 is a flowchart illustrating the operation of creating a plurality of path graphs of FIG. 1, according to an exemplary embodiment.

FIG. 4 is a flowchart illustrating the operation of creating a plurality of path graphs for a plurality of signals based on a plurality of TSV candidate grids (S200) as shown in FIG. 1, according to an exemplary embodiment.

Referring to FIGS. 1 and 4, when creating the path graphs, a first path graph representing all linkable first signal paths from a first source to a first sink with respect to a first signal from among a plurality of signals may be created (S210). In this case, all first signal graphs may be formed in one direction from the first source to the first sink, and the details thereof will be described later with reference to FIGS. 6B, 7A and 7B.

Similarly, second to $n^{th}$ path graphs may be created with respect to second to $n^{th}$ signals (n is equal to or greater than 2) from among the signals. A second path graph representing all linkable second signal paths from a second source to a second sink with respect to the second signal may be created (S230), and an $n^{th}$ path graph representing all linkable $n^{th}$ signal paths from an $n^{th}$ source to an $n^{th}$ sink with respect to the $n^{th}$ signal may be created (S250).

Figure 5:
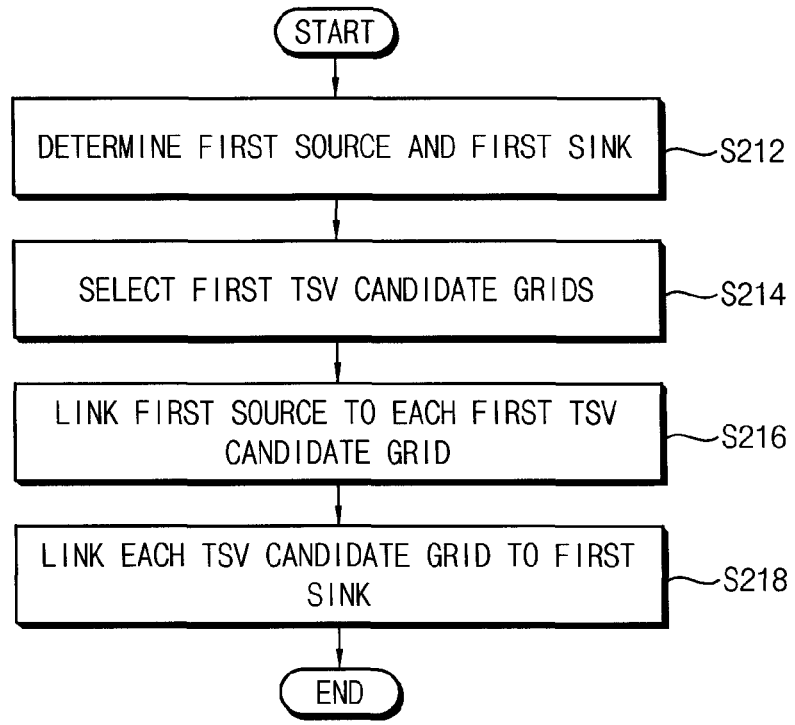
FIG. 5 is a flowchart illustrating the operation of creating a first path graph of FIG. 4, according to an exemplary embodiment.

FIG. 5 is a flowchart illustrating the operation of creating a first path graph representing all linkable first signal paths for a first signal (S210) as shown in FIG. 4, according to an exemplary embodiment. FIGS. 6A, 6B, 7A and 7B are views illustrating the flowchart of FIG. 5, according to exemplary embodiments.

Figure 6A:
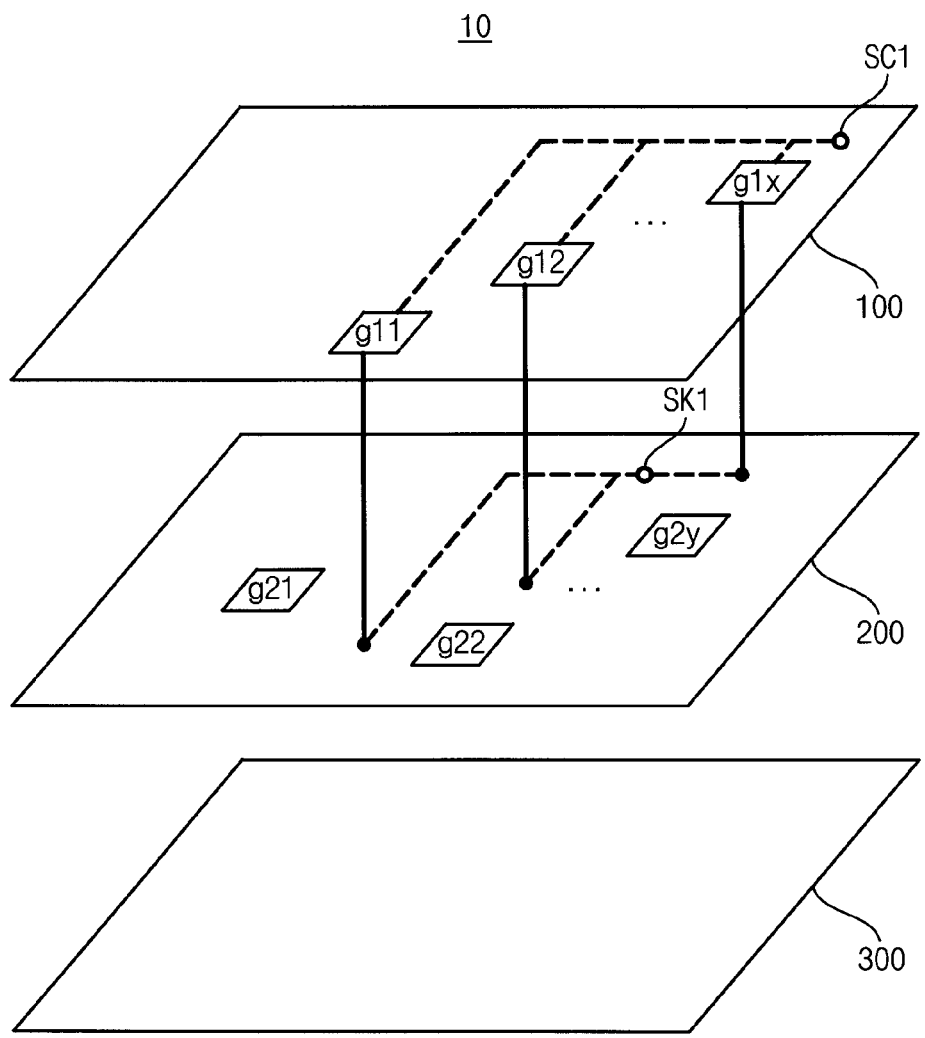
FIGS. 6A, 6B, 7A and 7B are views illustrating the operation of creating the first path graph of FIG. 5, according to exemplary embodiments.
Figure 6B:
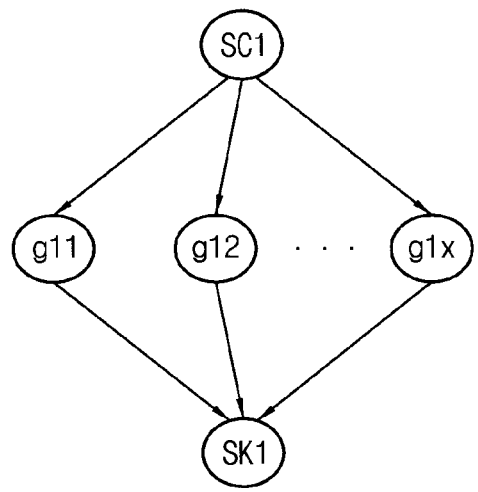

Referring to FIGS. 5, 6A, 6B, 7A and 7B, when creating the first path graph, a first source SC1 and a first sink SK1 may be determined (S212) with respect to the first signal. The first source SC1 may be arranged in the first semiconductor die 100, and the first sink SK1 may be arranged in the second semiconductor die 200. In FIGS. 5 and 6A, the first source SC1 and the first sink SK1 may be arranged in the semiconductor dies 100 and 200 adjacent to each other. As illustrated in FIG. 6B, the first source SC1 and the first sink SK1 may be expressed as terminal vertexes (that is, starting and ending points) of a first path graph PG1.

First TSV candidate grids g11, g12, ... and g1x arranged in the first semiconductor die 100 including the first source SC1 may be selected from among the TSV candidate grids g11, g12, ... and g1x, and g21, g22, ... and g2y (S214). As illustrated in FIG. 6B, the first TSV candidate grids g11, g12, ... and g1x may be expressed as intermediate vertexes (passing points) of the first path graph PG1.

The first source SC1 serving as a starting point is directly linked with each of the first TSV candidate grids g11, g12, ... and g1x serving as the passing points (S216), and each of the first TSV candidate grids g11, g12, ... and g1x is directly linked with the first sink SK1 serving as the ending point (S218), thereby completing the first path graph PG1. The first path graph PG1 may include an x (x is a natural number) number of the first signal paths. Further, in the first path graph PG1, the vertexes SC1, SK1, g11, g12, ... and g1x correspond to a source, a sink and TSV candidate grids, and edges to link two vertexes to each other may correspond to the plane wires (that is, 2D wires).

Figure 7A:
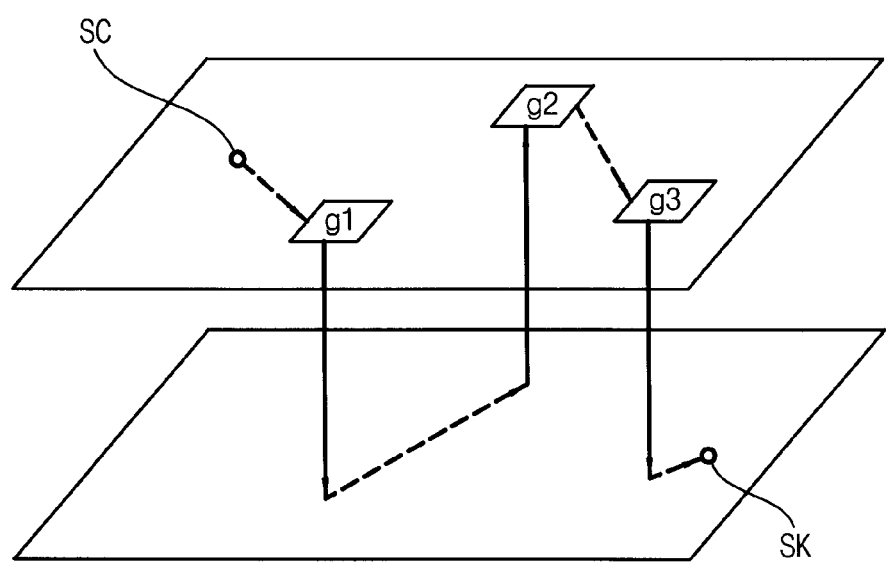
Figure 7B:
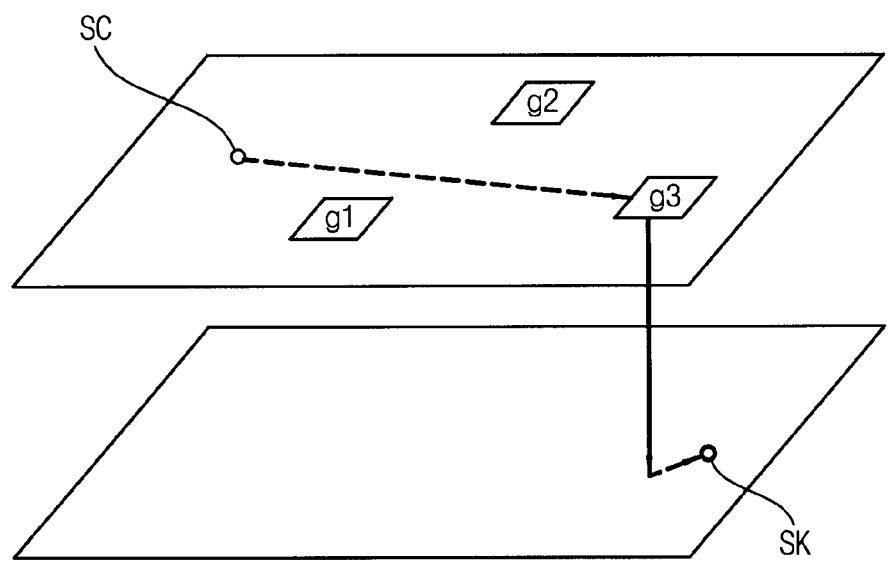

According to an exemplary embodiment, the first path graph PG1 may be formed in one direction. In other words, all first signal paths to link the first source SC1 to the first sink SK1 may include only one of the first TSV candidate grids g11, g12, ... and g1x, respectively. If the path graph has no unidirectionality, for example, if a signal path to link a source SC to a sink SK passes through at least two of the first TSV candidate grids g1, g2 and g3 as illustrated in FIG. 7A, many TSVs are unnecessarily inserted, causing a round trip. On the contrary, if the path graph has unidirectionality, for example, if a signal path to link a source SC to a sink SK passes through only one TSV candidate grid g3 as illustrated in FIG. 7B, the minimum number of TSVs is inserted, thereby preventing the round trip, and reducing a length of a signal network.

Figure 8:
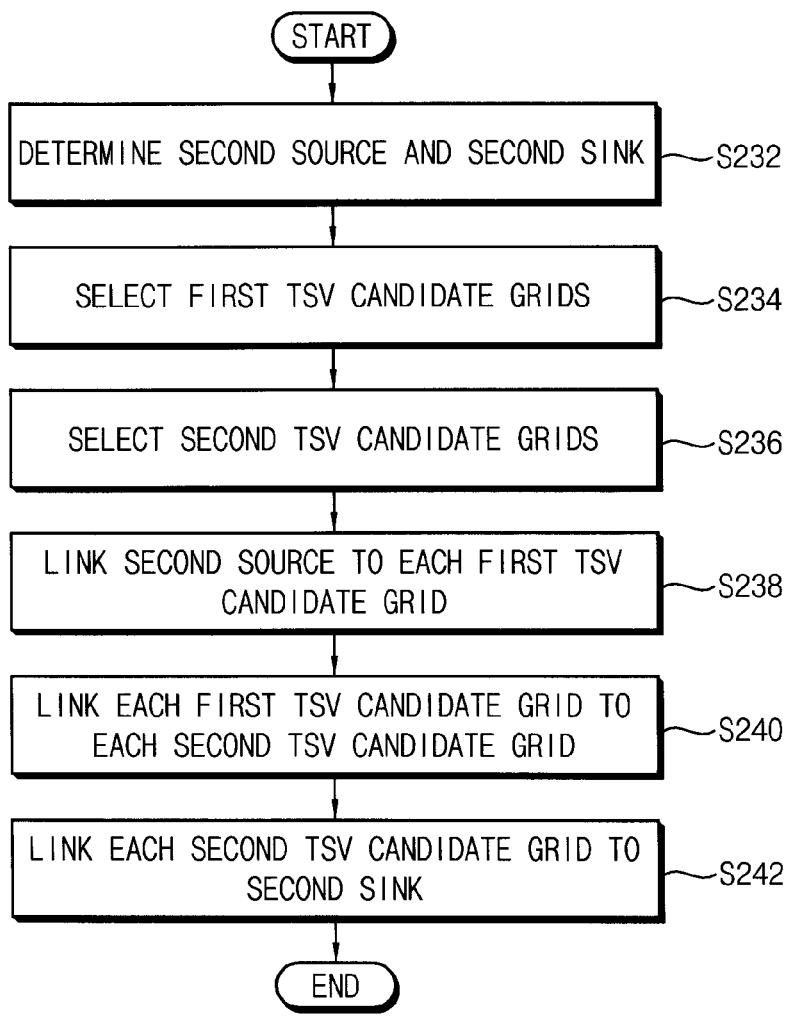
FIG. 8 is a flowchart illustrating the operation of creating a second path graph of FIG. 4, according to an exemplary embodiment.
Figure 9A:
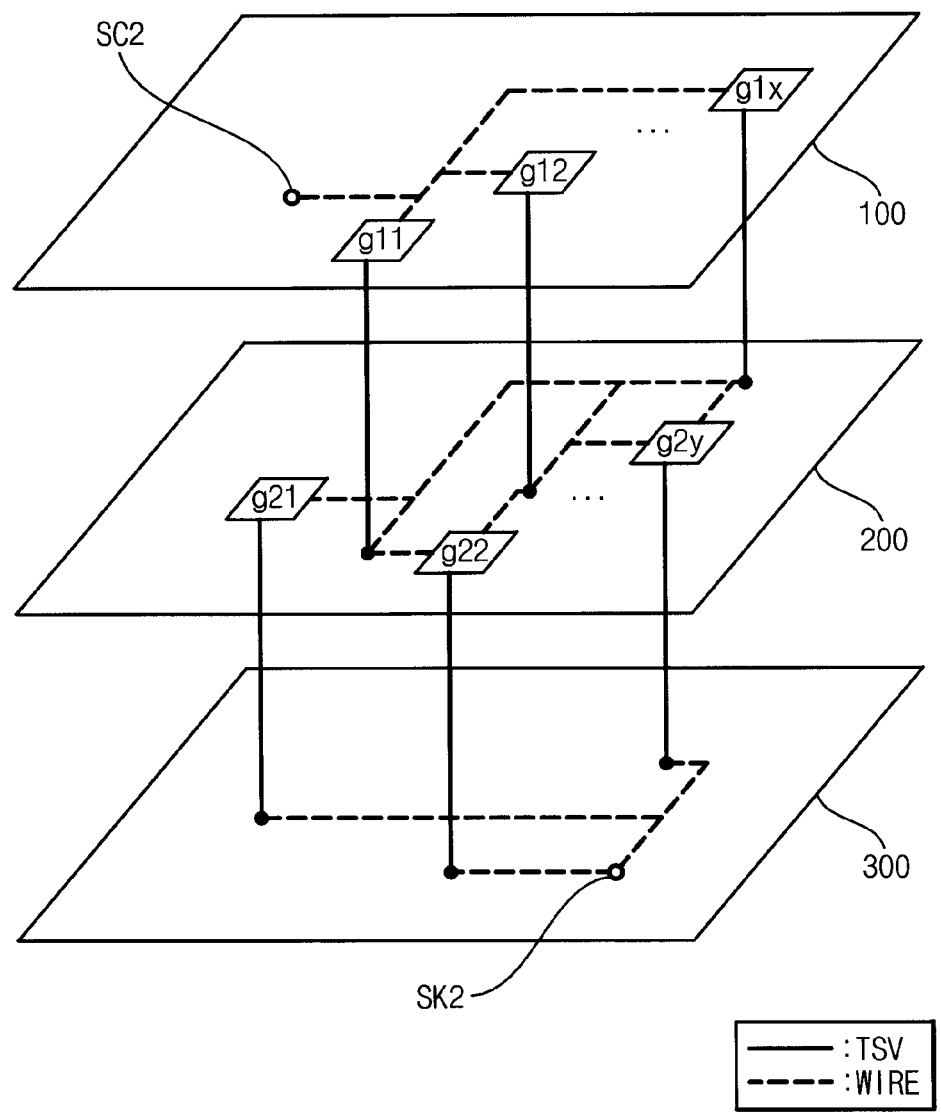
FIGS. 9A and 9B are views illustrating the operation of creating the second path graph of FIG. 8, according to exemplary embodiments.
Figure 9B:
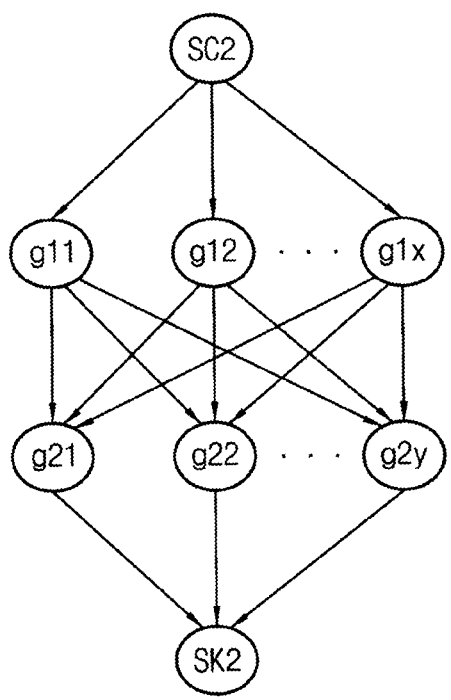

FIG. 8 is a flowchart illustrating the operation of creating a second path graph representing all linkable second signal paths for a second signal (S230) as shown in FIG. 4, according to an exemplary embodiment. FIGS. 9A and 9B are views illustrating the flowchart of FIG. 8, according to exemplary embodiments.

Referring to FIGS. 8, 9A and 9B, when creating the second path graph, a second source SC2 and a second sink SK2 may be determined with respect to the second signal (S232). The second source SC2 may be arranged in the first semiconductor die 100, and the second sink SK2 may be arranged in the third semiconductor die 300. In FIGS. 8 and 9A, the second source SC2 and the second sink SK2 may be arranged in the semiconductor dies 100 and 300 that are separated from each other (that is, are not adjacent to each other). As illustrated in FIG. 9B, the second source SC2 and the second sink SK2 may be expressed as terminal vertexes of the second path graph PG2.

The first TSV candidate grids g11, g12, ... and g1x arranged in the first semiconductor die 100 including the second source SC2 may be selected from among the TSV candidate grids g11, g12, ... and g1x, and g21, g22, ... and g2y (S234), and the second TSV candidate grids g21, g22, ... and g2y arranged in the second die 200 between the first semiconductor die 100 and the third semiconductor die 300 may be selected (S236). As illustrated in FIG. 9B, the first TSV candidate grids g11, g12, ... and g1x, and the second TSV candidate grids g21, g22, ... and g2y may be expressed as intermediate vertexes (passing points) of the second path graph PG2.

The second source SC2 serving as a starting point is directly linked with each of the first TSV candidate grids g11, g12, ... and g1x serving as the passing points (S238), each of the first TSV candidate grids g11, g12, ... and g1x is directly linked with each of the second TSV candidate grids g21, g22, ... and g2y serving as second passing points (S240), and each of the second TSV candidate grids g121, g22, ... and g2y is directly linked with the second sink SK2 serving as an ending point (S242), thereby completing the second path graph PG2. In this case, the second path graph PG2 may include xxy (y is a natural number) number of second signal paths. In other words, the second path graph PG2 may have unidirectionality. In other words, all second signal paths to link the second source SC2 to the second sink SK2 may not include only one of the first TSV candidate grids g11, g12, ... and g1x and only one of the second TSV candidate grids g121, g22, ... and g2y.

Figure 10A:
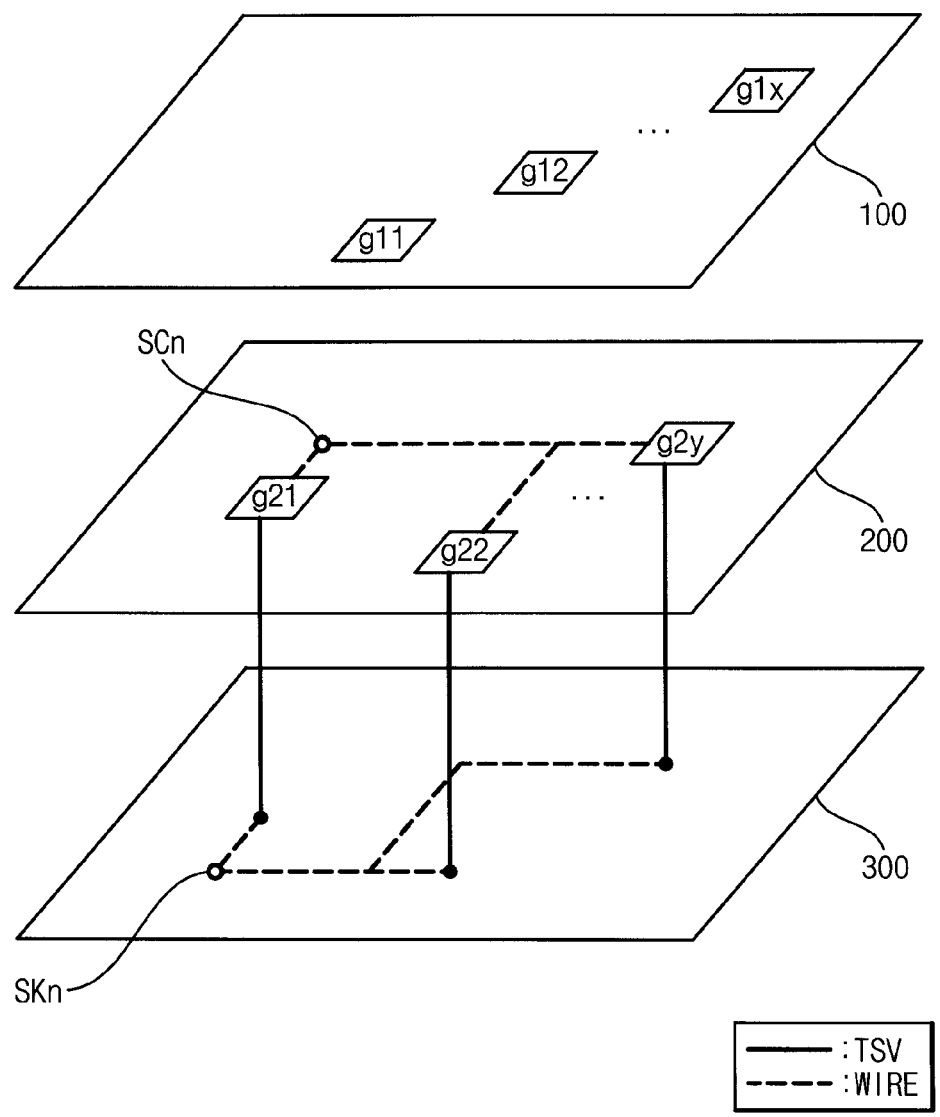
FIGS. 10A and 10B are views illustrating the operation of creating an $n^{th}$ path graph of FIG. 4, according to exemplary embodiments.
Figure 10B:
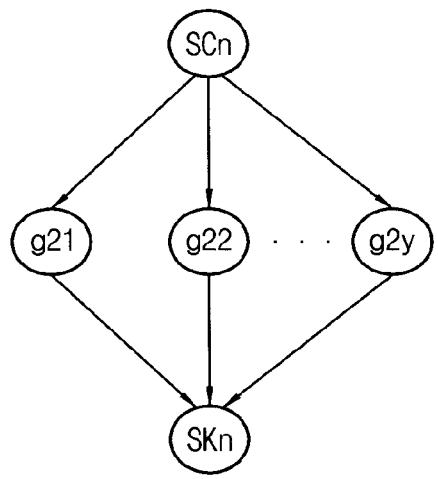

FIGS. 10A and 10B are views illustrating the operation of creating an nth path graph representing all linkable nth signal paths of an $n^{th}$ signal (S250) as shown in FIG. 4, according to exemplary embodiments.

Referring to FIGS. 10A and 10B, the operation of creating the $n^{th}$ path graph may be similar to the operation of creating the first path graph. In detail, an $n^{th}$ source SCn and an $n^{th}$ sink SKn may be determined with respect to the $n^{th}$ signal. The $n^{th}$ source SCn may be arranged in the second semiconductor die 200, and the $n^{th}$ sink SKn may be arranged in the third semiconductor die 300. The second TSV candidate grids g21, g22, ... and g2y arranged in the second semiconductor die 200 including the $n^{th}$ source SCn may be selected from among the TSV candidate grids g11, g12, ... and g1x, and g21, g22, ... and g2y. The $n^{th}$ source SCn is directly linked with each of the second TSV candidate grids g21, g22, ... and g2y, and each of the second TSV candidate grids g21, g22, ... and g2y is directly linked with the $n^{th}$ sink SKn, thereby completing the $n^{th}$ path graph PGn. In this case, the $n^{th}$ path graph PGn may include a y number of $n^{th}$ signal paths, and may have unidirectionality.

Although a procedure of creating a plurality of path graphs PG1, PG2, ... and PGn has been described with reference to FIGS. 4 to 10, the configuration of the path graphs may be varied depending on the number of semiconductor dies included in the stacked semiconductor device, the number of TSV candidate grids, and the positions of sources/sinks for a plurality of signals. Meanwhile, although FIGS. 6B, 9B and 10B illustrate that the path graphs have one direction from an upper semiconductor die to a lower semiconductor die, at least a portion of the path graphs may have one direction from the lower semiconductor die to the upper semiconductor die depending on the positions of the sources/sinks of the signals.

Figure 11:
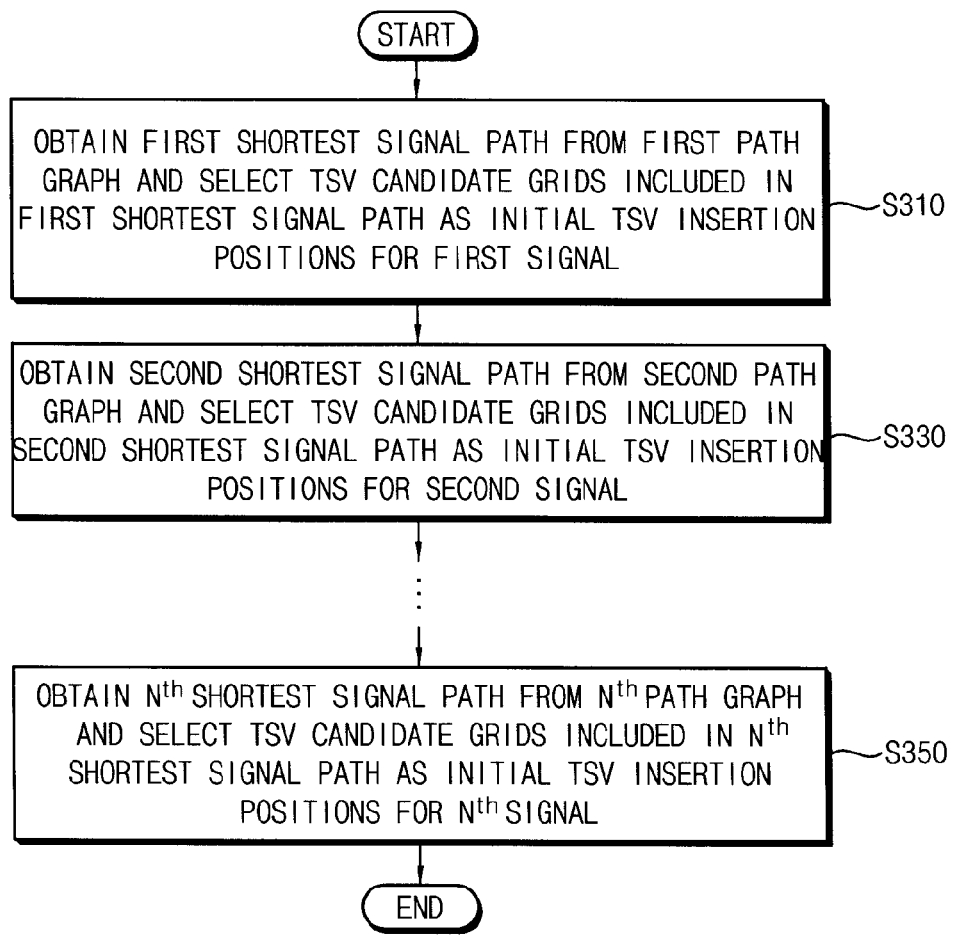
FIG. 11 is a flowchart illustrating the operation of determining initial TSV insertion positions of FIG. 1, according to an exemplary embodiment.

FIG. 11 is a flowchart illustrating the operation of determining initial TSV insertion positions based on the plurality of path graphs (s300) as shown in FIG. 1, according to an exemplary embodiment. FIGS. 12A, 12B, 12C and 12D are views illustrating the flowchart of FIG. 11, according to exemplary embodiments.

Referring to FIGS. 11, 12A, 12B, 12C and 12D, when determining the initial TSV insertion positions, the initial TSV insertion positions may be determined by considering lengths of the signal paths for each of the first to the $n^{th}$ signals, so that each of the first to the $n^{th}$ signal paths constituting first to $n^{th}$ signal networks has the shortest length among the signal paths for each of the first to the $n^{th}$ signals, respectively.

Figure 12A:
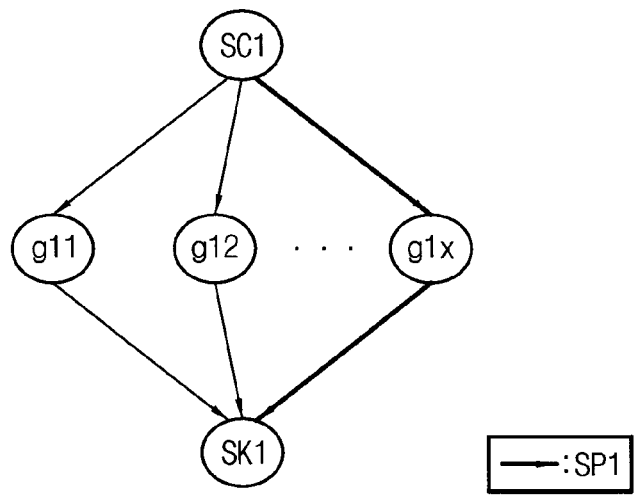
FIGS. 12A, 12B, 12C and 12D are views illustrating the operation of determining the initial TSV insertion positions of FIG. 11, according to exemplary embodiments.

In detail, a first shortest signal path is obtained among the first signal paths included in the first path graph PG1, and TSV candidate grids included in the first shortest signal path among the TSV candidate grids g11, ... and g1x, and g21, ... and g2y may be selected as the initial TSV insertion positions for the first signal (S310). For example, as illustrated in FIG. 12A, if the first shortest signal path SP1 is obtained, TSV candidate grid g1x included in the first shortest signal path SP1 may be selected as the initial TSV insertion position for the first signal.

According to an exemplary embodiment, the first shortest signal path SP1 may be obtained through a Dijkstra algorithm. The Dijkstra algorithm is one of algorithms to search for the shortest path for two predetermined points in a graph including a plurality of points. Since the Dijkstra algorithm is generally known to those skilled in the art, and the details thereof will be omitted. According to an exemplary embodiment, the first shortest signal path may be obtained based on one of algorithms, such as a Bellman-Ford algorithm or a Floyd-Warshall to find various shortest signal paths.

Figure 12B:
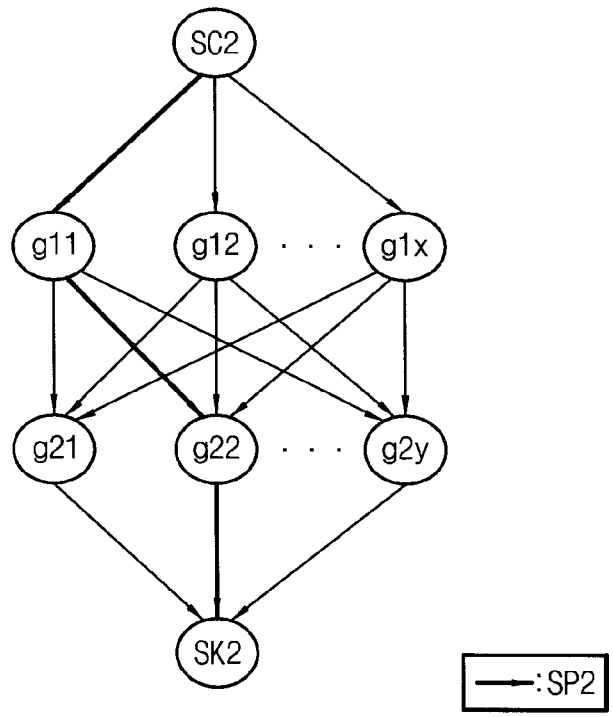
Figure 12C:
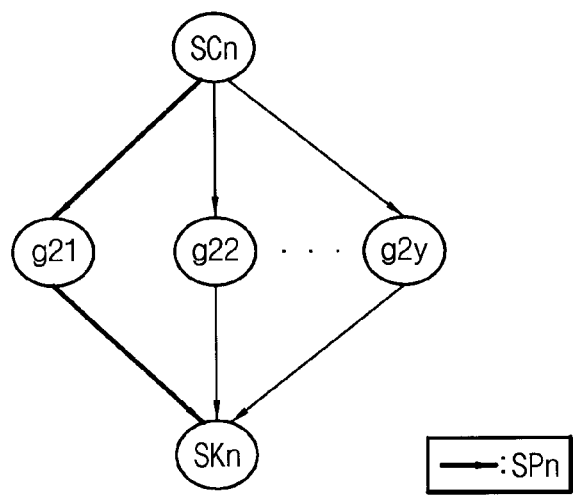

Similarly, the initial TSV insertion positions for the second to the $n^{th}$ signals may be selected. The second shortest signal path may be obtained among the second signal paths included in the second path graph PG2, and TSV candidate grids included in the second shortest signal path among the TSV candidate grids g11, g12, ... and g1x, and g21, g22, ... and g2y may be selected as the initial TSV candidate grids for the second signal (S330). For example, as illustrated in FIG. 12B, if the second shortest signal path SP2 is obtained, the TSV candidate grids g11 and g22 included in the second shortest path SP2 may be the initial TSV candidate grids for the second signal. An $n^{th}$ shortest signal path may be obtained among the $n^{th}$ signal paths included in the $n^{th}$ path graph PGn, and TSV candidate grids included in the $n^{th}$ shortest signal path among the TSV candidate grids g11, g12, ... and g1x, and g21, g22, ... and g2y may be selected as the initial TSV candidate grids for the $n^{th}$ signal (S350). For example, as illustrated in FIG. 12C, if the $n^{th}$ shortest signal path SPn is obtained, the TSV candidate grid g21 included in the $n^{th}$ shortest signal path SPn may be selected as the initial TSV insertion position for the $n^{th}$ signal. The second to $n^{th}$ shortest signal paths may also be obtained based on one of the various shortest path search algorithms as discussed above.

Figure 12D:
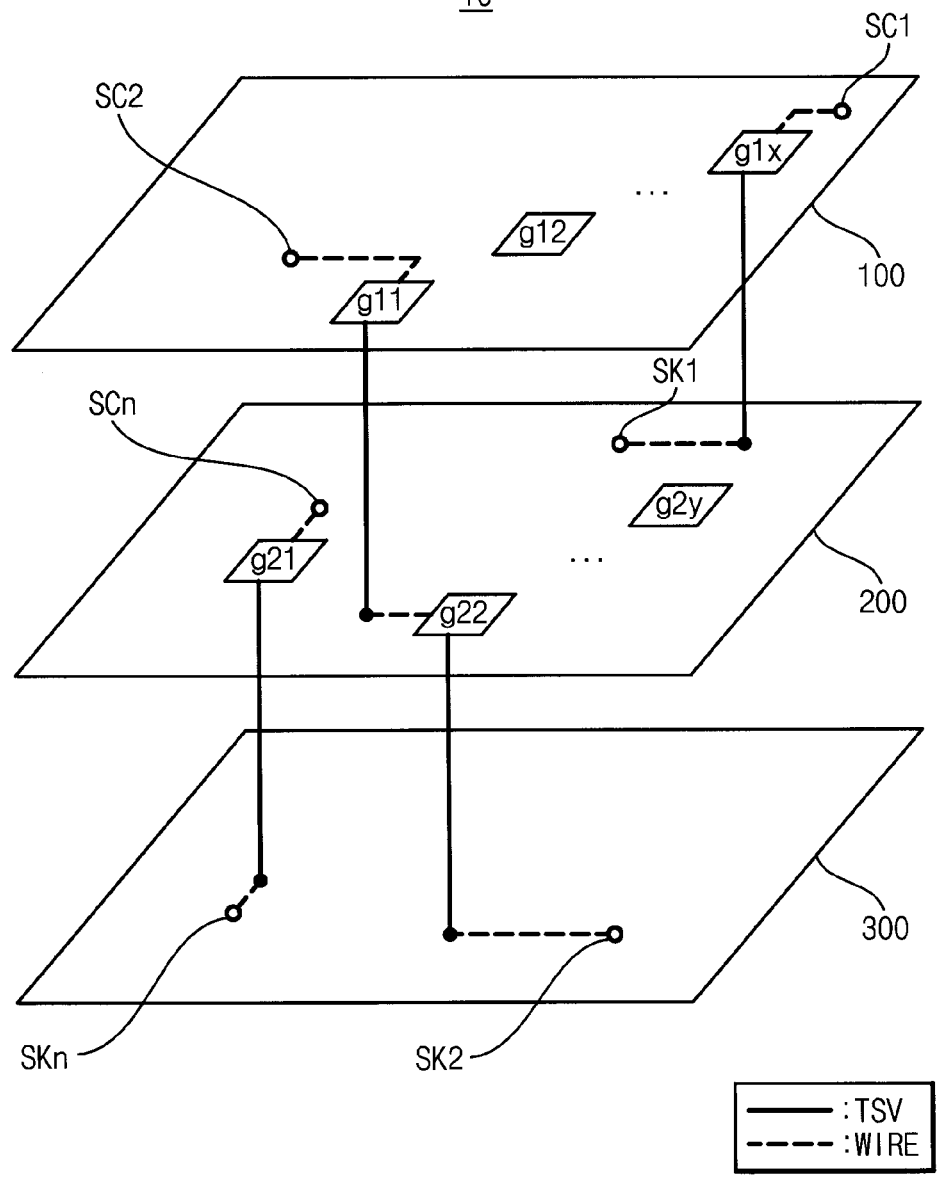

After all initial TSV insertion positions have been selected with respect to the first to the $n^{th}$ signals transmitted through the stacked semiconductor device 10, as illustrated in FIG. 12D, TSVs are arranged in the TSV candidate grids g11, g1x, g21 and g22 selected as the initial TSV insertion positions, and plane wires are arranged on the semiconductor dies 100, 200 and 300 depending on sources and/or sinks and the positions of the inserted TSVs, thereby forming the first to the $n^{th}$ signal networks for the first to the $n^{th}$ signals, respectively. Although not illustrated in FIG. 12D, the plane wires may be arranged to pass through the normal grids G11 and G12 as illustrated in FIG. 3.

Figure 13:
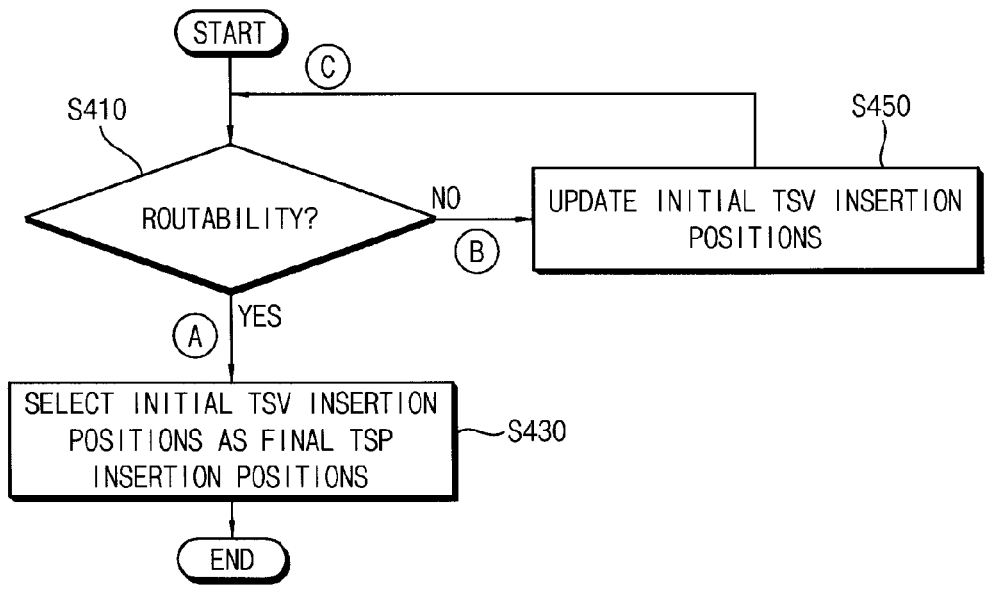
FIG. 13 is a flowchart illustrating the operation of determining final TSV insertion positions of FIG. 1, according to an exemplary embodiment.

FIG. 13 is a flowchart illustrating the operation of determining final TSV insertion positions by verifying the initial TSV insertion positions (S400) as shown in FIG. 1, according to an exemplary embodiment.

Referring to FIG. 13, when determining the final TSV insertion positions, the final TSP insertion positions may be determined by considering routability and the lengths of the first to the $n^{th}$ signal networks so that the first to the $n^{th}$ signal networks can be normally realized.

In detail, verification to determine the routability for the first signal network to the $n^{th}$ signal network may be performed (S410). Although not illustrated in FIG. 12D, when forming the first to the $n^{th}$ signal networks based on the initial TSV insertion positions, several TSVs may be arranged at one TSV candidate grid due to a TSV connection failure, or several plane wires may be arranged in one normal grid due to a wire failure. In this case, if TSVs or the plane wires are arranged with a number larger than the allowable number of TSV candidate grids or normal grids, at least one of the first to the $n^{th}$ signal networks and the stacked semiconductor device including the at least one of the first to the $n^{th}$ signal networks may not be normally realized. Accordingly, the verification operation is performed to determine the final TSV insertion positions such that the length of each of the first to the $n^{th}$ signal networks is minimized and the wire failure does not occur to form optimized signal paths. The verification operation may be performed by investigating congestion of the TSV candidate grids and the normal grids, and the details thereof will be described later with reference to FIGS. 14, 15A, 15B, 15C, 16A, 16B and 16C.

If it is determined that the first to the $n^{th}$ signal networks have routability based on the result of the verification operation (S410, Yes), the initial TSV insertion positions determined in operation S300 of FIG. 1 may be selected as the final TSP insertion positions (S430).

If it is determined that at least one of the first to the $n^{th}$ signal networks has no routability based on the result of the verification result (S410, No), the initial TSV insertion positions may be updated (S450). For example, at least one of the initial TSV insertion positions may be changed based on the congestion of the TSV candidate grids and the normal grids. The update operation will be described in detail with reference to FIGS. 17, 18A, 18B, 19B, 19C and 19D.

Operation S410 may be performed again after the update operation. In other words, the verification operation for the initial TSV insertion positions, which are updated, may be performed again. The verification operation and the update operation may be repeatedly performed until all of the first to the $n^{th}$ signal networks are determined as having routability based on the result of the verification operation.

Figure 14:
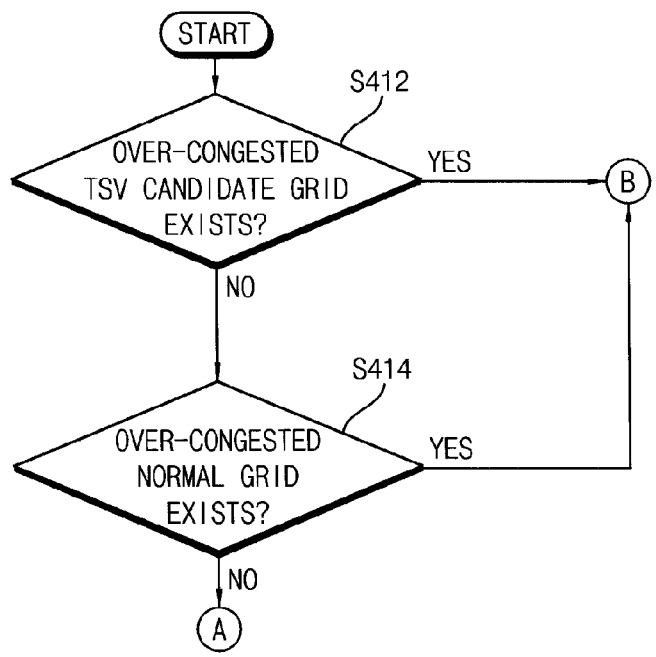
FIG. 14 is a flowchart illustrating the operation of performing the verification operation of FIG. 13, according to an exemplary embodiment.

FIG. 14 is a flowchart illustrating the verification operation (S410) as shown in FIG. 13, according to an exemplary embodiment. FIGS. 15A, 15B, 15C, 16A, 16B and 16C are views illustrating the flowchart of FIG. 14.

Referring to FIGS. 12D, 14, 15A, 15B, 15C, 16A, 16B and 16C, when performing the verification operation to determine the routability for the first to the $n^{th}$ signal networks, the number of TSVs arranged in each of the TSV candidate grids g11, g1x, g21 and g22 selected as the initial TSV insertion positions may be counted to determine if over-congested TSV candidate grids exist (S412). The over-congested TSV candidate grids represent TSV candidate grids in which TSVs are arranged with a number greater than the allowable number of TSVs among the TSV candidate grids g11, g1x, g21 and g22 selected as the initial TSV insertion positions. The allowable number of TSVs may be determined based on the area of the TSV candidate grids and the size of the TSVs resulting from semiconductor fabricating process conditions.

Figure 15A:
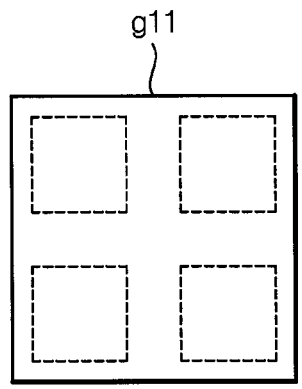
FIGS. 15A, 15B, 15C, 16A, 16B and 16C are views illustrating the verification operation of FIG. 14, according to exemplary embodiments.
Figure 15B:
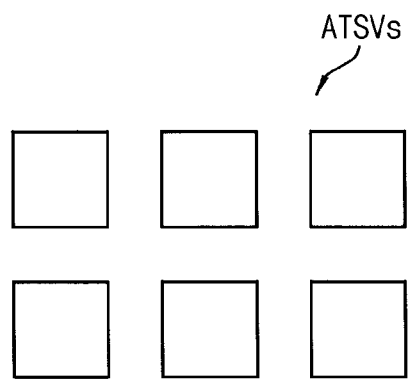
Figure 15C:
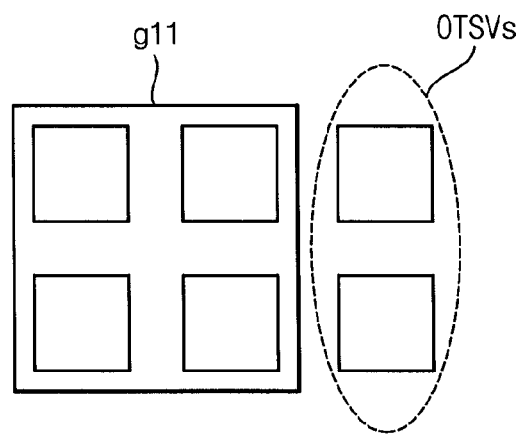

For example, as illustrated in FIG. 15, four TSVs may be arranged in the TSV candidate grid g11. In other words, the allowable number of TSVs of the TSV candidate grid g11 may be four. However, when the first to the $n^{th}$ signal networks are to be formed based on the initial TSV insertion positions, six TSVs ATSVs may be assigned to the TSV candidate grid g11. In this case, as illustrated in FIG. 15C, four TSVs among the six TSVs ATSVs may be arranged in the TSV candidate grid g11. However, remaining two TSVs may not be arranged. Accordingly, at least one of the first to the $n^{th}$ signal network may not be normally realized.

If it is determined that the over-congested TSV candidate grids do not exist (S412, No), the number of plane wires arranged in the normal grid is counted based on the initial TSV insertion positions to determine if the over-congested normal grid exists (S414). The over-congested normal grid represents a normal grid, in which plane wires are arranged with a number greater than the allowable number of wires (for example, the number of reference wires), among normal grids. The allowable number of wires may be determined based on the areas of the normal grids and the width of the plane wires resulting from semiconductor fabricating process conditions.

Figure 16A:
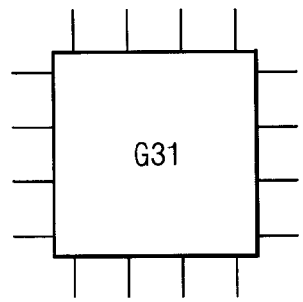
Figure 16B:
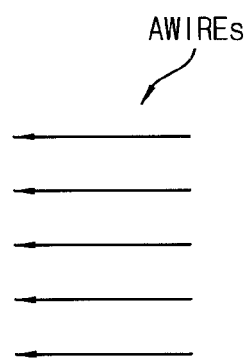
Figure 16C:
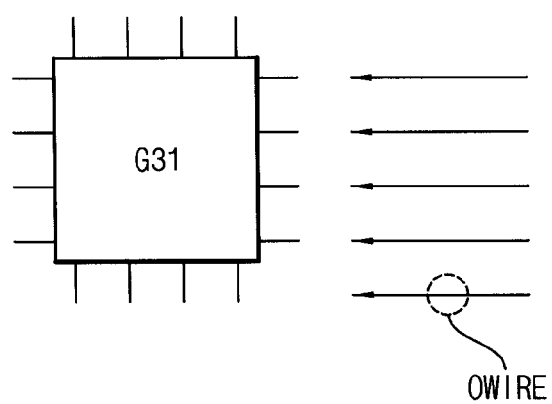

For example, as illustrated FIG. 16A, four plane wires may be arranged in a normal grid G31. In other words, the allowable number of wires of the normal grid G31 may be 4. However, when the first signal network to the $n^{th}$ signal network are to be formed based on the initial TSV insertion positions, five plane wires AWIREs may be assigned to the normal grid G31 as illustrated in FIG. 16B. In this case, although four plane wires among five plane wires AWIREs may be arranged in the normal grid G31 as illustrated in FIG. 16C, a remaining one plane wire OWIRE may not be arranged in the normal grid G31. Accordingly, at least one of the first to the $n^{th}$ signal networks may not be normally realized.

If it is determined that the over-congested normal grid does not exist (S414, No), that is, if over-congested grids including the over-congested TSV candidate grids and the over-congested normal grid do not exist, operation S430 of FIG. 13 is performed so that the initial TSV insertion positions may be selected as the final TSV insertion positions.

If it is determined that the over-congested TSV candidate grid exists (S412, Yes), or the over-congested normal grid exists (S414, Yes), that is, if at least one of the over-congested grids exists, operation S450 of FIG. 13 is performed to update the initial TSV insertion positions.

According to an exemplary embodiment, operations S412 and S414 may be sequentially performed, and substantially simultaneously performed. If operations S412 and S414 are sequentially performed, operation S412 may be first performed as illustrated in FIG. 14, and operation S414 may be first performed although not illustrated, according to an exemplary embodiment.

FIG. 17 is a flowchart illustrating the operation of updating the initial TV insertion positions (S45) as shown in FIG. 13. FIGS. 18A, 18B, 19A, 18B, 19C and 19D are views illustrating the flowchart of FIG. 17, according to exemplary embodiments.

Figures 18B, 19A:
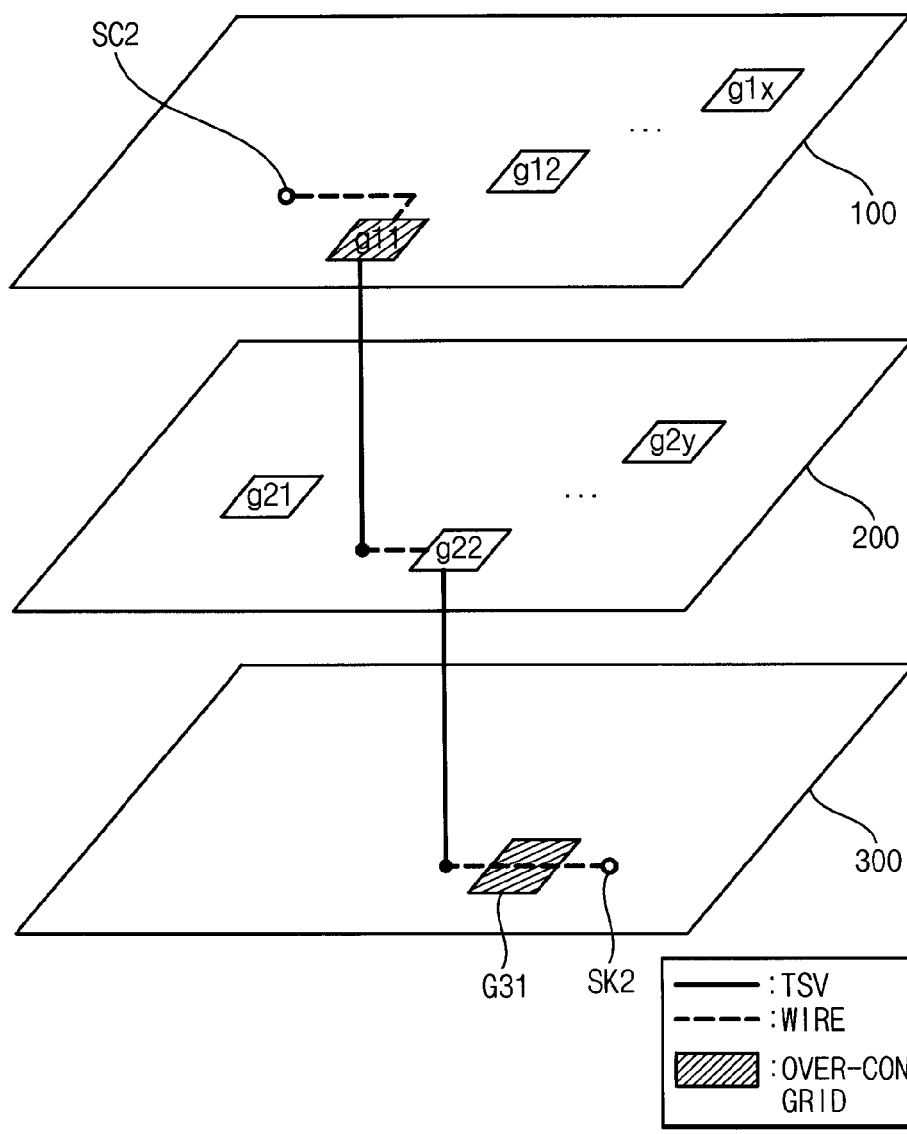

Referring to FIGS. 17, 18A, 18B, 19A, 19B, 19C and 19D, when updating the initial TSV insertion positions, an over-congestion list may be obtained based on the over-congested grids including the over-congested TSV candidate grids and the over-congested normal grid (S452). The over-congestion list may include names of the over-congested grids and names of signal networks passing through the over-congested grids. For example, the over-congestion list may be obtained as illustrated in FIG. 18A. In the example of FIG. 18A, signal networks net2, net7, net12, . . . and netN pass through the over-congested TSV candidate grid (CTG) g11, and the signal networks net2, net5, . . . and netN may pass through the over-congested normal grid (CNG) G31.

A signal network having the highest priority of re-arrangement may be selected among the signal networks based on the over-congestion list (S454). For example, a signal network passing through the most over-congested grids among the signal networks may be selected. In the example of FIG. 18A, the second signal network net2 passes through two over-congested grids g11 and G31, and each of the signal networks net5, net7 and net12 passes one over-congested grid g11 or G31. Since the number of over-congested grids through which the second signal network net2 passes is more than the number of over-congested grids through which other signal networks net5, net7 and net12 pass, the second signal network n2 may be selected as a signal network having the highest priority of re-arrangement.

According to an exemplary embodiment, if at least two signal networks passing through the largest number of over-congested grids exist, a signal network having updated initial TSV insertion positions and the lowest length increment thereafter may be selected among the two signal networks as the signal network having the highest priority of re-arrangement. For example, when the update operation is performed, the list representing the length increments for each signal network may be obtained as illustrated in FIG. 18B. In the example of FIG. 18, the signal networks net2, net4 and net9 may pass through the same number (for example, 2) of over-congested grids. In this case, with respect to each of signal networks net2, net4, net9, . . . and netN, the length increments of the wire are calculated after the initial TSV insertion positions are updated, and sorted in ascending order. The second signal network net2 having the lowest length increment after the initial TSV insertion positions have been updated may be selected as a signal network having the highest priority of re-arrangement.

A path graph n to the signal network selected as the signal network having the highest priority of re-arrangement among the path graphs created in operation S200 of FIG. 1 may be modified (S456). In detail, the path graph corresponding to the selected signal network is selected, and a congested region corresponding to the over-congested grids may be removed from the selected path graph.

For example, as described above with reference to FIGS. 18A and 18B, when the second signal network net2 passing through the largest number of over-congested grids g11 and G31 is selected, the second path graph (PG2 of FIG. 9B) corresponding to the second signal network net2 (that is, corresponding to the second signal) may be selected. As illustrated in FIG. 19A, the over-congested TSV candidate grid g11 is arranged in the first semiconductor die 100, and the over-congested normal grid G31 may be arranged in the third semiconductor die 300.

Figure 19B:
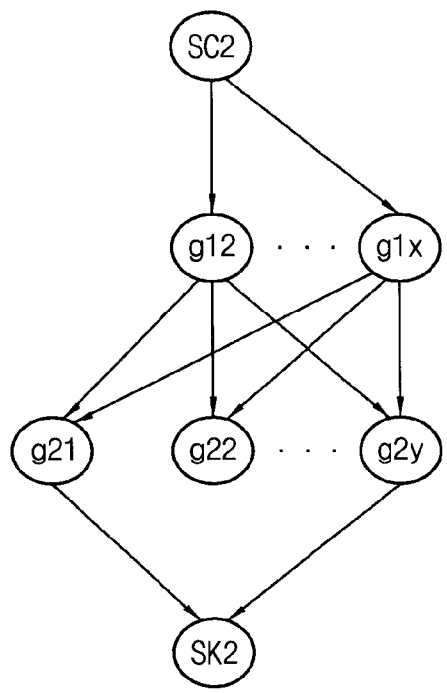

The congested regions corresponding to the over-congested grids g11 and G31 may be deleted from the second path graph PG2. For example, the intermediate vertex g11 corresponding to the over-congested TSV candidate grids g11 and signal paths linked with the intermediate vertex g11 are deleted, and a signal path corresponding to the over-congested normal grid G31 is deleted, thereby obtaining the second path graph PG2, which is updated, as illustrated in FIG. 19B.

Based on the modified path graph in operation S456, at least a portion of the initial TSV insertion positions for the signal network selected as having the highest priority of re-arrangement may be changed (S458). The updated shortest signal path is obtained based on the path graph having no the congested regions. A portion of the TSV candidate grids is removed from the initial TSV insertion positions based on the updated shortest signal path. A portion of the TSV candidate grids may be selected as the initial TSV insertion positions.

Figure 19C:
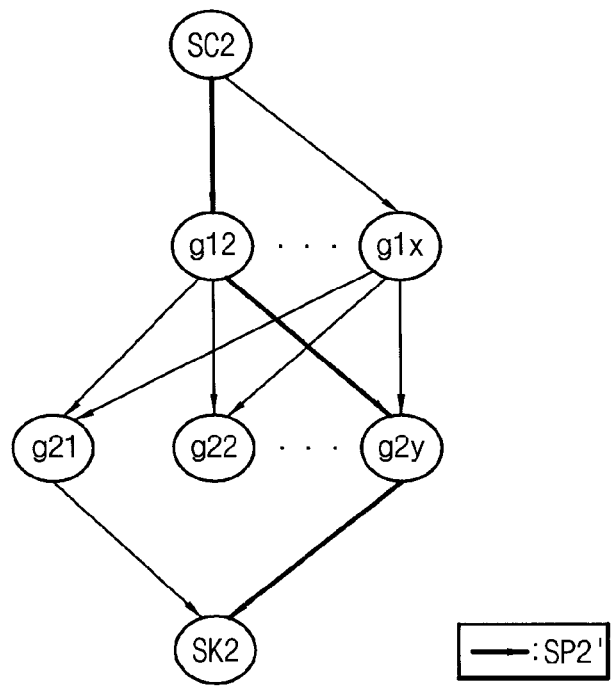

For example, as described with reference to FIG. 19B, if the updated second path graph PG' is obtained, an updated second signal path SP2' for the updated second path PG' can be obtained as illustrated in FIG. 19C. The updated second shortest signal path SP2' may be obtained based on one of various shortest path search algorithms described with reference to FIG. 11.

Figure 19D:
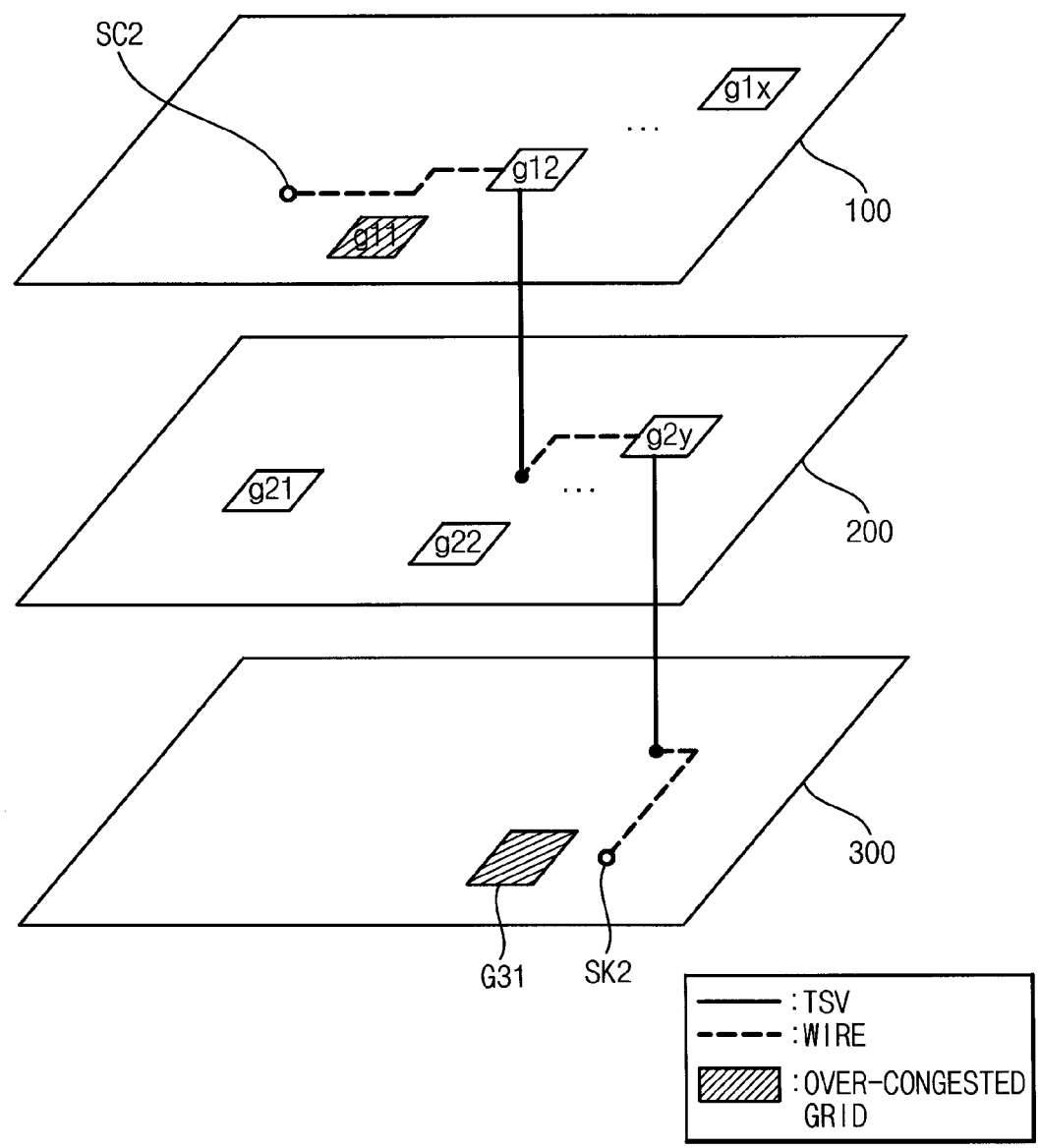

As illustrated in FIG. 19D, the TSV candidate grids g11 and g22, which are not included in the updated second shortest signal path SP2 among TSV candidate grids selected as the initial TSV insertion positions for the second signal, are excluded from the initial TSV insertion positions. Instead, the TSV candidate grids g12 and g2y included in the updated second shortest signal path SP2' are selected as the initial TSV insertion positions, thereby updating the initial TSV insertion positions.

When comparing with the second signal network (see FIG. 12D) formed based on the initial TSV insertion positions (for example, g11 and g22), the second signal network (see FIG. 19D) formed based on the updated TSV insertion positions (for example, g12 and g2y) are realized without the over-congested grids. Accordingly, the stacked semiconductor device may be designed to have the optimized signal path without a TSV connection failure and/or a wire failure.

Although the above description has been made with reference to FIGS. 17 to 19D in that the initial TSV insertion positions are updated, the initial TSV insertion positions may be updated by selecting at least two signal networks having the highest priority of re-arrangement according to an exemplary embodiment.

Figure 20:
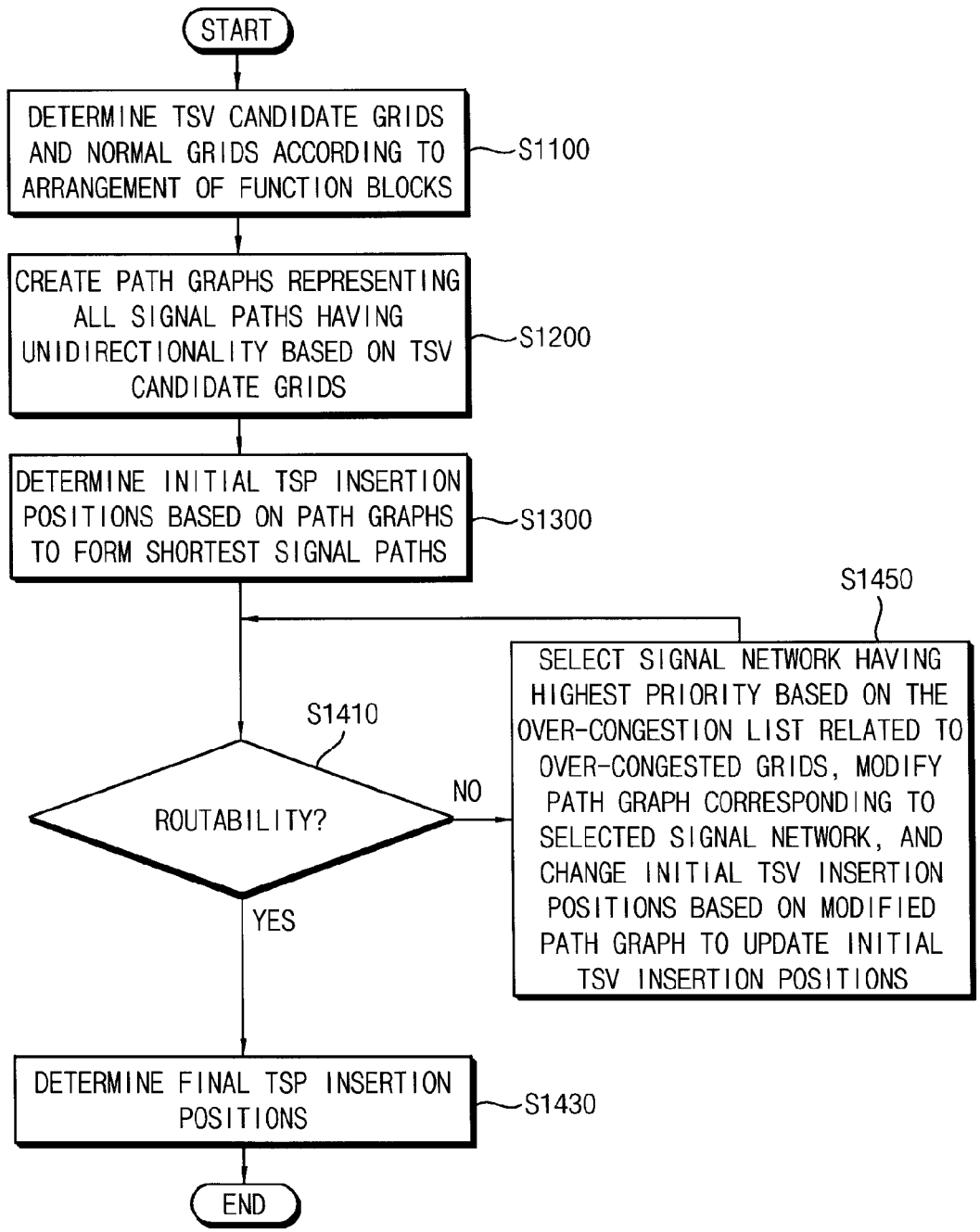
FIG. 20 is a flowchart illustrating a method of designing arrangement of TSVs a the stacked semiconductor device according to an exemplary embodiment.

FIG. 20 is a flowchart illustrating a method of designing arrangement of TSVs in the stacked semiconductor device according to an exemplary embodiment.

Referring to FIG. 20, arrangement of a plurality of function blocks are determined in semiconductor dies stacked in a stacked semiconductor device, and a plurality of TSV candidate grids and a plurality of normal grids according to the arrangement of the function blocks are determined (S1100). A plurality of path graphs, which represent all signal paths having unidirectionalty, which may link sources of signals transmitted through the stacked semiconductor device to sinks of the signals are created based on the TSV candidate grids (S1200). Initial TSV insertion positions are determined based on the path graphs so that the shortest signal path is formed with respect to each of the signal (S1300). Operation S1100 is substantially identical to operation S100 of FIG. 1, and may be performed as described with reference to FIGS. 2 and 3. Operation 1200 is substantially identical to step S200 of FIG. 1, and may be performed as described with reference to FIGS. 4 to 10B. Operation 1300 is substantially identical to operation S300 of FIG. 1, and may be performed as described with reference to FIGS. 11-12D.

When a plurality of signal networks are formed with respect to the signals based on the initial TSV insertion positions, verification operation to determine routability of the signal networks is performed (S1410). If it is determined that the signal networks have routability, based on the result of the verification operation (S1410, Yes), the initial TSV insertion positions may be determined to be the final TSP insertion positions (S1430). If it is determined that at least one of the signal networks has not routability based on the result of the verification operation (S1410, No), the initial TSV insertion positions are updated (S1450). In detail, an over-congestion list is obtained based on over-congested candidate grids among the TSV candidate grids and over-congested normal grids among the normal grids. From the over-congestion list, signal networks passing through the over-congested TSV grids and the over-congested normal grids are determined, and then, a signal network having the highest priority of re-arrangement is selected among these signal networks. Then, a path graph corresponding to the selected signal network among the path graphs is modified, and at least a portion of the initial TSV insertion positions for the selected signal network is changed based on the modified path graph, thereby updating the initial TSV insertion positions. Operations S1410, S1430 and S1450 are substantially identical to operations S400 of FIG. 1, and may be performed as described with reference to FIGS. 13 to 19D.

Figure 21:
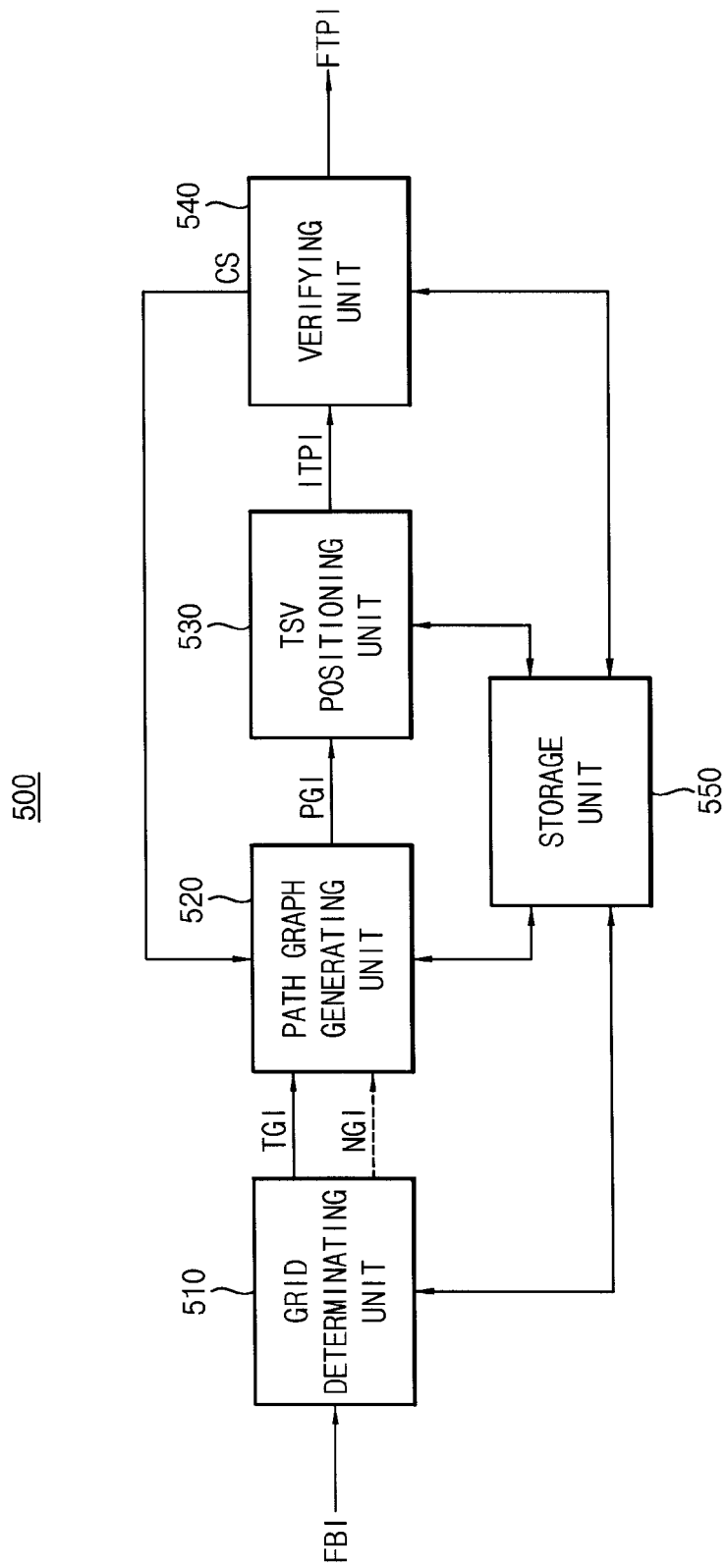
FIG. 21 is a block diagram illustrating a system for designing arrangement of TSVs in a stacked semiconductor device according to an exemplary embodiment

FIG. 21 is a block diagram illustrating a system 500 for designing arrangement of TSVs in a stacked semiconductor device according to an exemplary embodiment.

Referring to FIG. 21, the system 500 includes a grid determining unit 510, a path graph generating unit 520, a TSV positioning unit 530, a verifying unit 540 and a storage unit 550.

The grid determining unit 510 generates TSV candidate grid information (TGI) based on function block arrangement information (FBI). The FBI is information related to arrangement of a plurality of function blocks included in a plurality of semiconductor dies in a stacked semiconductor device, and the TGI is information related to positions in which TSVs are inserted into the semiconductor dies. As described above, according to the exemplary embodiments, since the insertion positions of the TSVs are determined in the state that a floor plan representing the arrangement of the function blocks is designated, the FBI may be previously determined and provided. According to an exemplary embodiment, the grid determining unit 510 may further generate normal grid information (NGI) based on the FBI. The NGI be information related to positions in which plane wires may be inserted into the semiconductor dies.

The path graph generating unit 520 generates path graph information (PGI) based on the TGI. The PGI is information related to a plurality of path graphs, and the path graphs are graphs representing all signal paths from sources of a plurality of signals transmitted through the stacked semiconductor device to sinks of the signals and having unidirectionality. According to the exemplary embodiment, the PGI may be generated based on the TGI and the NGI.

The TSV positioning unit 530 generates initial TSV insertion positions information (ITPI) based on the PGI. The ITPI is information related to initial positions of the TSVs inserted into the stacked semiconductor device and determined in such a manner that the shortest signal path is formed with respect to each of the signals.

The verifying unit 540 generates final TSV insertion position information (FTPI) or a control signal (CS) by performing a verification operation for the ITPI. The verification operation is to determine routability with respect to a plurality of signal networks when forming the signal networks for the signals based on the ITPI.

If it is determined that the signal networks have routability, based on the result of the verification operation, the verifying unit 540 may generate the final TSP insertion position information (FTPI). The FTPI is information related to the final positions (for example, optimized positions) of the TSVs inserted into the stacked semiconductor device. If it is determined that at least one of the signal network has no routability, based on the result of the verification operation, the verifying unit 540 may generate the CS. The path graphs contained in the PGI are updated based on the CS, and the initial positions of the TSVs contained in the ITPI may be updated based on the updated path graph. The verification operation and the update operation may be repeatedly performed until all signal networks to be formed have routability.

The storage unit 550 may store computation results and/or simulation results performed in the grid determining unit 510, the path graph generating unit 520, the TSV positioning unit 530 and the verifying unit 540.

According to an exemplary embodiment, all or some of the grid determining unit 510, the path graph generating unit 520, the TSV positioning unit 530 and the verifying unit 540 may be implemented in the form of a program stored in an integrated chip (IC) and executable by a processor such as a central processing unit (CPU), or implemented in the form of a hardware.

The system for designing the arrangement of TSVs in the stacked semiconductor device according to the exemplary embodiments is driven based on the method of designing the arrangement of TSVs in the stacked semiconductor device described with reference to FIGS. 1 to 20, so that the stacked semiconductor device can be designed to have the optimized signal path without a TSV connection failure and a wire failure.

Figure 22:
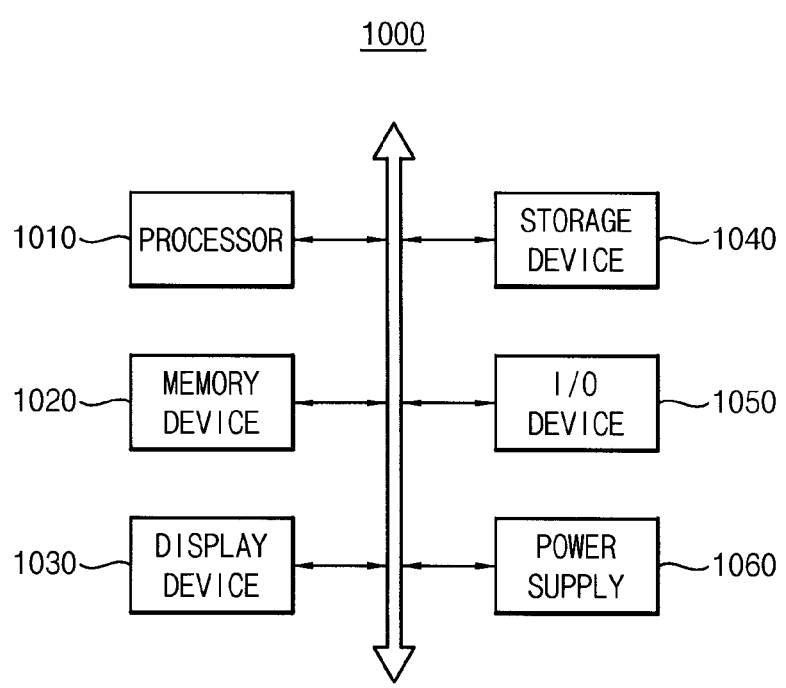
FIG. 22 is a block diagram illustrating a computing system according to an exemplary embodiment.

FIG. 22 is a block diagram illustrating a computing system according to an exemplary embodiment.

Referring to FIG. 22, a computing system 1000 may include a processor 1010, a memory device 1020, a display device 1030, a storage device 1040, an input/output (I/O) device 1050 and a power supply 1060. Meanwhile, as illustrated in FIG. 22, the computing system 1000 may include ports to make a communication with a video card, a sound card, a memory card and a universal serial bus (USB) device, or to make communication with other electronic devices.

The processor 1010 may perform specific computations or specific tasks. According to an exemplary embodiment, the processor 1010 may include a micro-processor or a CPU. The processor 1010 can make communication with the memory device 1020, the display device 1030, the storage device 1040 and the I/O device 1050 through an address bus, a control bus and a data bus. According to an exemplary embodiment, the processor 1010 may be further connected to an expansion bus, such as a peripheral component interconnect (PCI) bus.

The memory device 1020 may store data required for the operation of the computing system 1000. For example, the memory device 1020 may be implemented as a volatile memory device, such as a dynamic random access memory (DRAM), a static random access memory (SRAM) or a mobile DRAM. In addition, the memory device 1020 may be implemented as a nonvolatile memory device, such as an electrically erasable programmable read-only memory (EEPROM), a flash memory, a phase change random access memory (PRAM), a resistance random access memory (RRAM), an nano floating gate memory (NFGM), a polymer random access memory (PoRAM), an magnetic random access memory (MRAM) or an ferroelectric random access memory (FRAM).

The display device 1030 may display images required for the operation of the computing system 1000. For example, the display device 1030 may include a liquid crystal display (LCD) device, an organic light emitting diode (OLED) display device, a plasma display panel (PDP) device, etc.

The storage device 1040 may include a solid state drive, a hard disk drive, or a compact disc ROM (CD-ROM). The I/O device 1050 may include an input unit such as a keyboard, a keypad, or a mouse and an output unit such as a printer. The power supply 1060 may supply the operating voltage required for the operation of the computing system 1000.

At least a portion of semiconductor devices included in the computing system 1000 may be implemented in the form of a stacked semiconductor device (that is, 3D integrated circuit). The stacked semiconductor device is designed through the method described with reference to FIGS. 1 to 20 to have the optimized signal path without a TSV connection failure and a wire failure.

According to an exemplary embodiment, the computing system 1000 and/or components of the computing system 1000 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi-chip package (MCP), wafer-level fabricated package (WFP), or wafer-level processed stack package (WSP).

According to an exemplary embodiment, the computing system 1000 may be any computing system, such as a personal computer (PC), a server computer, a workstation, a tablet computer, a laptop computer, a mobile phone, a smart phone, a personal digital assistant (PDA), a portable media player (PMP), a digital camera, a digital television, a set-top box, a music player, a portable game console, a navigation device, etc.

The exemplary embodiment is applicable to a stacked semiconductor device and various devices and various systems including the same. Therefore, the application of the exemplary embodiment can be enlarged to a computer, a laptop computer, a hand-held phone, a cellular phone, an MP3 player, a personal digital assistant, a portable multimedia player, a digital TV and a digital camera including the stacked semiconductor device.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various exemplary embodiments and is not to be construed as limited to the specific exemplary embodiments disclosed and that modifications to the disclosed exemplary embodiments, as well as other exemplary embodiments, are intended to be included within the scope of the appended claims.

What is claimed is:

1. A method of designing arrangement of through silicon vias (TSVs) in a stacked semiconductor device, the method comprising:
    determining, by a grid determining unit, a plurality of TSV candidate grids representing positions, into which the TSVs are insertable, in each of a plurality of semiconductor dies stacked mutually and included in the stacked semiconductor device;
    creating, by a path graph generating unit, a plurality of path graphs representing linkable signal paths for a plurality of signals transmitted through the stacked semiconductor device, respectively, based on the TSV candidate grids;
    determining, by a TSV positioning unit, initial TSV insertion positions corresponding to shortest signal paths for the signals based on the path graphs; and
    determining, by a verifying unit, final TSV insertion positions by verifying the initial TSV insertion positions so that a plurality of signal networks for the signals have routability,
    wherein at least one of the determining the plurality of TSV candidate grids, the creating the plurality of path graphs, the determining the initial TSV insertion positions, and the determining the final TSV insertion positions is performed by a computer.

2. The method of claim 1, wherein the creating the path graphs comprises:
    creating a first path graph representing all linkable first signal paths from a first source to a first sink for a first signal of the signals; and
    creating a second path graph representing all linkable second signal paths from a second source to a second sink for a second signal of the signals.

3. The method of claim 2, wherein the creating the first path graph comprises:
    determining the first source arranged in a first semiconductor die of the semiconductor dies and the first sink arranged in a second semiconductor die of the semiconductor dies;
    selecting first TSV candidate grids arranged in the first semiconductor die from among the TSV candidate grids;
    directly linking the first source to each of the first TSV candidate grids; and
    linking each of the first TSV candidate grids to the first sink.

4. The method of claim 3, wherein the creating the first path graph further comprises selecting second TSV candidate grids, which are arranged in a third semiconductor die interposed between the first and second semiconductor dies, from among the TSV candidate grids, and
    wherein the linking the first sink to each of the first TSV candidate grids comprises:
    directly linking each of the first TSV candidate grids to each of the second TSV candidate grids; and
    directly linking each of the second TSV candidate grids to the first sink.

5. The method of claim 3, wherein the first path graph has unidirectionality such that the all first signal paths to link the first source to the first sink comprise only one of the first TSV candidate grids.

6. The method of claim 2, wherein the determining the initial TSV insertion positions comprises:
    obtaining a first shortest signal path from among the first signal paths and selecting first TSV candidate grids included in the first shortest signal path among the TSV candidate grids as the initial TSV insertion positions for the first signal; and
    obtaining a second shortest signal path from among the second signal paths and selecting second TSV candidate grids included in the second shortest signal path among the TSV candidate grids as the initial TSV insertion positions for the second signal.

7. The method of claim 6, wherein the determining the final TSV insertion positions comprises:
    performing a verification operation to determine routability for first and second signal networks determined by the first and second path graphs when the first and second signal networks are formed by arranging a plurality of first TSVs in the first and second TSV candidate grids selected as the initial TSV insertion positions and by arranging a plurality of first wires on the semiconductor dies;
    selecting the initial TSV insertion positions as the final TSV insertion positions if it is determined that the first and second signal networks have the routability based on a result of the verification operation; and
    updating the initial TSV insertion positions if it is determined that at least one of the first and second signal networks has no routability based on the result of the verification operation.

8. The method of claim 7, wherein each of the semiconductor dies comprises a plurality of normal grids representing insertable positions of wires, and the first wires pass through first and second normal grids corresponding to the first and second signal networks among the normal grids, and
    wherein the performing the verification operation comprises:
    determining existence of an over-congested TSV candidate grid having TSVs arranged with a number larger than an allowable number of TSVs among the first and second TSV candidate grids by counting a number of the first TSVs arranged in the first and second TSV candidate grids; and determining existence of an over-congested normal grid having wires arranged with a number larger than an allowable number of TSVs among the first and second normal grids by counting a number of the first wires arranged in the first and second normal grids.

9. The method of claim 8, wherein the updating the initial TSV insertion positions comprises:

acquiring an over-congestion list listing at least one over-congested grid comprising the over-congested TSV candidate grid and the over-congested normal grid;

selecting a signal network having a highest priority of re-arrangement among the first and second signal networks, based on the over-congestion list;

modifying a path graph corresponding to the selected signal network among the path graphs; and changing at least a portion of the initial TSV insertion positions corresponding to the selected signal network based on the modified path graph.

10. The method of claim 9, wherein the selecting the signal network having the highest priority of re-arrangement comprises selecting a signal network passing through a largest number of over-congested grids among the first and second signal networks.

11. The method of claim 10, wherein a signal network having a lowest length increment after the initial TSV insertion positions have been updated is selected when the first and second signal networks pass through an equal number of the over-congested grids.

12. The method of claim 9, wherein the modifying the path graph corresponding to the selected signal network comprises:

selecting the path graph corresponding to the selected signal network; and deleting a congested region corresponding to the over-congested grids from the selected path graph.

13. The method of claim 12, wherein the changing the at least a portion of the initial TSV insertion positions comprises:

obtaining a third shortest signal path based on the path graph having no congested region; and excluding a portion of the first and second TSV candidate grids, which is not included in the third shortest signal path, from the initial TSV insertion positions, or selecting a third TSV candidate grid, which is included in the third shortest signal path and different from the first and second TSV candidate grids, as the initial TSV insertion positions.

14. The method of claim 7, further comprising re-performing a verification operation for the updated initial TSV insertion positions, wherein the updating the initial TSV insertion positions is repeatedly performed until it is determined that the first and second signal networks have routability based on a result of the verification operation.

15. A system for designing arrangement of TSVs in a stacked semiconductor device comprising a plurality of semiconductor dies stacked on one another, the system comprising:

a grid determining unit configured to generate TSV candidate grid information related to positions, in which the TSVs are insertable, in the semiconductor dies based on function block arrangement information related to arrangement of a plurality of functional blocks included in the semiconductor dies;

a path graph generating unit configured to generate path graph information related to a plurality of path graphs that represent all signal paths from at least one source to at least one sink for a plurality of signals transmitted through the stacked semiconductor device and have uni-directionality, based on the TSV candidate grid information;

a TSV positioning unit configured to generate initial TSV insertion position information related to initial positions of the TSVs inserted into the stacked semiconductor device based on the path graph information such that a shortest signal path is formed with respect to each of the signals; and a verifying unit configured to generate final TSV insertion position information related to final positions of the TSVs inserted into the stacked semiconductor device, or a control signal to update the path graph information and the initial TSV insertion position information, by performing a verification operation for the initial TSV insertion position information.

* * * * *